(12) United States Patent
Min

(10) Patent No.: US 9,640,681 B2
(45) Date of Patent: May 2, 2017

(54) WINDOW STRUCTURE, METHOD OF MANUFACTURING THE SAME, ELECTRONIC DEVICE EQUIPPED WITH A CAMERA INCLUDING A WINDOW STRUCTURE AND METHOD OF MANUFACTURING THE SAME

(71) Applicant: Samsung Display Co., Ltd., Yongin, Gyeonggi-Do (KR)

(72) Inventor: Myung-An Min, Yongin (KR)

(73) Assignee: Samsung Display Co., Ltd., Samsung-ro, Gihueng-Gu, Yongin-si, Gyeonggi-Do (KR)

( * ) Notice: Subject to any disclaimer, the term of this patent is extended or adjusted under 35 U.S.C. 154(b) by 336 days.

(21) Appl. No.: 13/797,696

(22) Filed: Mar. 12, 2013

(65) Prior Publication Data

US 2013/0313672 A1 Nov. 28, 2013

(30) Foreign Application Priority Data

May 23, 2012 (KR) ........................ 10-2012-0054731

(51) Int. Cl.
*H04N 5/225* (2006.01)
*H01L 31/0232* (2014.01)
(Continued)

(52) U.S. Cl.
CPC .......... *H01L 31/0232* (2013.01); *G02B 5/005* (2013.01); *G02B 5/22* (2013.01);
(Continued)

(58) Field of Classification Search
USPC .............................. 348/373; 257/434; 438/65
See application file for complete search history.

(56) References Cited

U.S. PATENT DOCUMENTS

H000654 H 7/1989 Doyle, Jr. et al.
7,049,528 B2 5/2006 Kariya et al.
(Continued)

FOREIGN PATENT DOCUMENTS

CN 1625805 A 6/2005
CN 1743938 A 3/2006
(Continued)

OTHER PUBLICATIONS

Taiwanese Office Action dated Jun. 23, 2016 issued by Taiwanese Patent Office in the corresponding Taiwanese Patent Application No. 102116830, which also claims Korean Patent Application Serial No. 10-2012-0054731 as its priority document and Request for Entry of the Accompanying Office Action.
(Continued)

*Primary Examiner* — Roberto Velez
*Assistant Examiner* — Stephen P. Coleman
(74) *Attorney, Agent, or Firm* — Robert E. Bushnell, Esq.

(57) ABSTRACT

A window structure includes a window, a design layer structure on the window, a light shield layer on the design layer structure, and a light absorption layer. The design layer structure includes a first hole exposing a portion of the window. The light shield layer includes a second hole in fluid communication with the first hole. The light absorption layer covers at least a portion of the design layer structure exposed by the first and second holes, and includes a third hole exposing a portion of the window. By including the light absorption layer of a gray or black color to cover exposed portions of the design layer structure, a vignette about an image caused by the design layer structure is prevented.

42 Claims, 25 Drawing Sheets

(51) Int. Cl.
    G02B 5/00      (2006.01)
    G02B 5/22      (2006.01)
    G02B 27/00     (2006.01)
    H01L 31/18     (2006.01)
    G03B 11/04     (2006.01)
    G03B 17/02     (2006.01)

(52) U.S. Cl.
    CPC .......... *G02B 27/0018* (2013.01); *G03B 11/04* (2013.01); *G03B 17/02* (2013.01); *H01L 31/18* (2013.01)

(56) References Cited

U.S. PATENT DOCUMENTS

| | | | |
|---|---|---|---|
| 7,616,250 | B2 | 11/2009 | Watanabe et al. |
| 7,654,757 | B2 | 2/2010 | Okumura |
| 7,867,793 | B2 | 1/2011 | Basin et al. |
| 8,823,202 | B2 | 9/2014 | Sugita |
| 2003/0168254 | A1* | 9/2003 | Kariya et al. ............ 174/261 |
| 2004/0041915 | A1 | 3/2004 | Mogamiya et al. |
| 2005/0100270 | A1* | 5/2005 | O'Connor ........... G02B 1/06 385/19 |
| 2006/0051085 | A1 | 3/2006 | Okumura |
| 2007/0133983 | A1* | 6/2007 | Traff ..................... 396/506 |
| 2009/0017566 | A1* | 1/2009 | Basin et al. ............. 438/26 |
| 2010/0138763 | A1* | 6/2010 | Kim ..................... 715/765 |
| 2011/0122303 | A1 | 5/2011 | Bonkohara |
| 2011/0141336 | A1 | 6/2011 | Mittleman |
| 2012/0008263 | A1* | 1/2012 | Sugita ............... 361/679.01 |
| 2013/0313672 | A1 | 11/2013 | Min |

FOREIGN PATENT DOCUMENTS

| | | |
|---|---|---|
| CN | 101743648 A | 6/2010 |
| CN | 102316184 A | 1/2012 |
| CN | 203337980 U | 12/2013 |
| CN | 203688963 U | 7/2014 |
| JP | 2001-111873 A | 4/2001 |
| JP | 2003-274234 A | 9/2003 |
| JP | 2006-41183 A | 2/2006 |
| JP | 2011-097026 A | 5/2011 |
| KR | 100989020 B1 | 10/2010 |
| KR | 20120004640 A | 1/2012 |
| TW | 201219836 A | 5/2012 |
| TW | 201220921 A | 5/2012 |

OTHER PUBLICATIONS

Office Action dated Sep. 21, 2016 from the Chinese Patent Office in the corresponding Chinese Patent Application No. 201310181276 to the above-identified application and a Request for Entry of the Accompanying Office Action.

Japanese Office Action issued by JPO on Mar. 14, 2017 in connection with Japanese Patent Application No. 2013-010361, which also claims Korean Patent Application Serial No. 10-2012-0054731 as its priority document and Request for Entry attached herewith.

\* cited by examiner

WINDOW STRUCTURE, METHOD OF MANUFACTURING THE SAME, ELECTRONIC DEVICE EQUIPPED WITH A CAMERA INCLUDING A WINDOW STRUCTURE AND METHOD OF MANUFACTURING THE SAME

CLAIM OF PRIORITY

This application claims priority under 35 U.S.C. §119 to Korean patent Application No. 2012-0054731 filed on May 23, 2012, the disclosure of which is hereby incorporated by reference herein in its entirety.

BACKGROUND OF THE INVENTION

Field of the Invention

An exemplary embodiment of the invention relate to a window structure, a method of manufacturing the same, an electronic device equipped with a camera including a window structure and a method of manufacturing the same.

Description of the Related Art

A window may be mounted on a display panel used in an electronic device, e.g., a cell phone, a personal media player (PMP), etc., and a design layer on which logos or icons are printed may be attached to the window. Recently, various types of electronic devices have been equipped with a camera, and a hole serving as a path of a light to a camera sensor may be formed through the design layer.

If the design layer has a chromatic color or a white color, a light passing by the hole may reflect diffusely at a portion of the design layer adjacent to the hole, and thus a color of the design layer may be transferred to surroundings of an image, i.e., a kind of vignetting may be caused.

SUMMARY OF THE INVENTION

An exemplary embodiment provides a window structure that may prevent vignetting.

An exemplary embodiment provides a method of manufacturing a window structure that may prevent vignetting.

An exemplary embodiment provides an electronic device equipped with a camera including a window structure that may prevent vignetting.

An exemplary embodiment provides a method of manufacturing an electronic device equipped with a camera including a window structure that may prevent vignetting.

According to one aspect of the present invention, there is provided a window structure that includes a window, a design layer structure arranged on the window, the design layer structure including a first hole exposing a portion of the window, a light shield layer arranged on the design layer structure, the light shield layer including a second hole in fluid communication with the first hole and a light absorption layer covering at least a portion of the design layer structure exposed by the first and second holes, the light absorption layer including a third hole exposing a portion of the window.

The second hole may have a diameter larger than that of the first hole. The first and second holes may have substantially a same diameter. The light absorption layer may cover at least a portion of a sidewall of the light shield layer exposed by the second hole. The light absorption layer may cover a portion of a top surface of the light shield layer. The light absorption layer may be absent from a top surface of the light shield layer. The design layer structure may include a plurality of design layers sequentially stacked on the window. The first hole may have a step shape of which a diameter increases from a bottom portion adjacent to a top surface of the window to a top portion furthest from the top surface of the window. The first hole may have a constant diameter in a direction substantially perpendicular to a top surface of the window. The first and second holes may have substantially the same diameter. The design layer structure may have a chromatic color or a white color, and the light shield layer and the light absorption layer may have a black color or a gray color. Each of the design layer structure, the light shield layer and the light absorption layer may be a printed layer. The first, second and third holes may have a boundary of a circle when viewed from a top side, and the light absorption layer may have a boundary of a circle, ellipse or polygon when viewed from a top side. The third hole may have a sidewall substantially perpendicular to a top surface of the window. The third hole may have a sidewall slanted with respect to a top surface of the window. The third hole may have a curved sidewall. The window structure may also include a polyethylene terephthalate (PET) film arranged on the window, and the design layer structure may be arranged on the PET film. The third hole may serve as a path through which a light incident on a camera sensor facing the light shield layer passes.

According to another aspect of the present invention, there is provided a method of manufacturing a window structure, including forming a design layer structure on a window, the design layer structure having a first hole exposing a portion of the window, forming a light shield layer on the design layer structure, the light shield layer having a second hole in fluid communication with the first hole and forming a light absorption layer covering at least a portion of the design layer structure exposed by the first and second holes, the light absorption layer having a third hole exposing a portion of the window. The forming of the light shield layer may include forming the light shield layer so that the second hole has a diameter larger than that of the first hole. The forming of the light absorption layer may include forming the light absorption layer to cover at least a portion of a sidewall of the light shield layer exposed by the second hole. The forming of the light absorption layer may include forming the light absorption layer to cover a portion of a top surface of the light shield layer. The forming of the design layer structure may include sequentially stacking a plurality of design layers on the window. The forming of the design layer structure may include forming the design layer structure so that the first hole has a step shape of which a diameter increases from a bottom portion adjacent to a top surface of the window to a top portion most distant from the top surface of the window. Each of the forming the design layer structure, the forming of the light shield layer and the forming of the light absorption layer may be produced by a screen printing process using a mesh.

According to another aspect of the present invention, there is provided a window structure, including a window, a design layer structure arranged on the window, the design layer structure including a first hole exposing a portion of the window and a light shield layer arranged on the window, the light shield layer covering the design layer structure and including a second hole exposing a portion of the window. The design layer structure may include a plurality of design layers sequentially stacked on the window. The first hole may have a step shape of which a diameter increases from a bottom portion adjacent to a top surface of the window to a top portion most distant from the top surface of the window. The design layer structure may have a chromatic color or a white color, and the light shield layer may have a black color or a gray color.

According to another aspect of the present invention, there is provided an electronic device, including a display panel arranged on a substrate, a window structure arranged on the display panel, the window structure including a window, a design layer structure arranged on the window, the design layer structure including a first hole exposing a portion of the window, a light shield layer arranged on the design layer structure, the light shield layer including a second hole in fluid communication with the first hole and a light absorption layer covering at least a portion of the design layer structure exposed by the first and second holes, the light absorption layer including a third hole exposing a portion of the window and a camera including a camera sensor arranged between the window structure and the substrate to detect light passing through the third hole.

The second hole may have a diameter larger than that of the first hole. The light absorption layer may cover at least a portion of a sidewall of the light shield layer exposed by the second hole. The light absorption layer may cover a portion of a top surface of the light shield layer. The design layer structure may include a plurality of design layers sequentially stacked on the window. The first hole may have a step shape of which a diameter increases from a bottom portion adjacent to a top surface of the window to a top portion most distant from the top surface of the window. The design layer structure may have a chromatic color or a white color, and the light shield layer and the light absorption layer may have a black color or a gray color. The window may have first surface facing the substrate and a second surface opposing the first surface, and wherein the design layer structure may be arranged on the first surface of the window. The display panel may be an organic light-emitting diode (OLED) display panel, a liquid crystal display (LCD) panel or a plasma display panel (PDP).

According to another aspect of the present invention, there is provided a method of manufacturing an electronic device, including forming a display panel on a substrate, forming a camera sensor on the substrate, the camera sensor being spaced apart from the display panel, forming a window structure, including providing a window, forming a design layer structure on the window, the design layer structure having a first hole exposing a portion of the window, forming a light shield layer on the design layer structure, the light shield layer having a second hole in fluid communication with the first hole and forming a light absorption layer covering at least a portion of the design layer structure exposed by the first and second holes, the light absorption layer having a third hole exposing a portion of the window and attaching the window structure onto the display panel so that the third hole overlaps the camera sensor and the design layer structure faces the substrate.

According to yet another aspect of the present invention, there is provided an electronic device, including a display panel arranged on a substrate, a window structure arranged on the display panel, the window structure including a window, a design layer structure arranged on the window, the design layer structure including a first hole exposing a portion of the window, and a light shield layer arranged on the window, the light shield layer covering the design layer structure and including a second hole exposing a portion of the window and a camera including a camera sensor arranged between the window structure and the substrate to detect light passing through the second hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
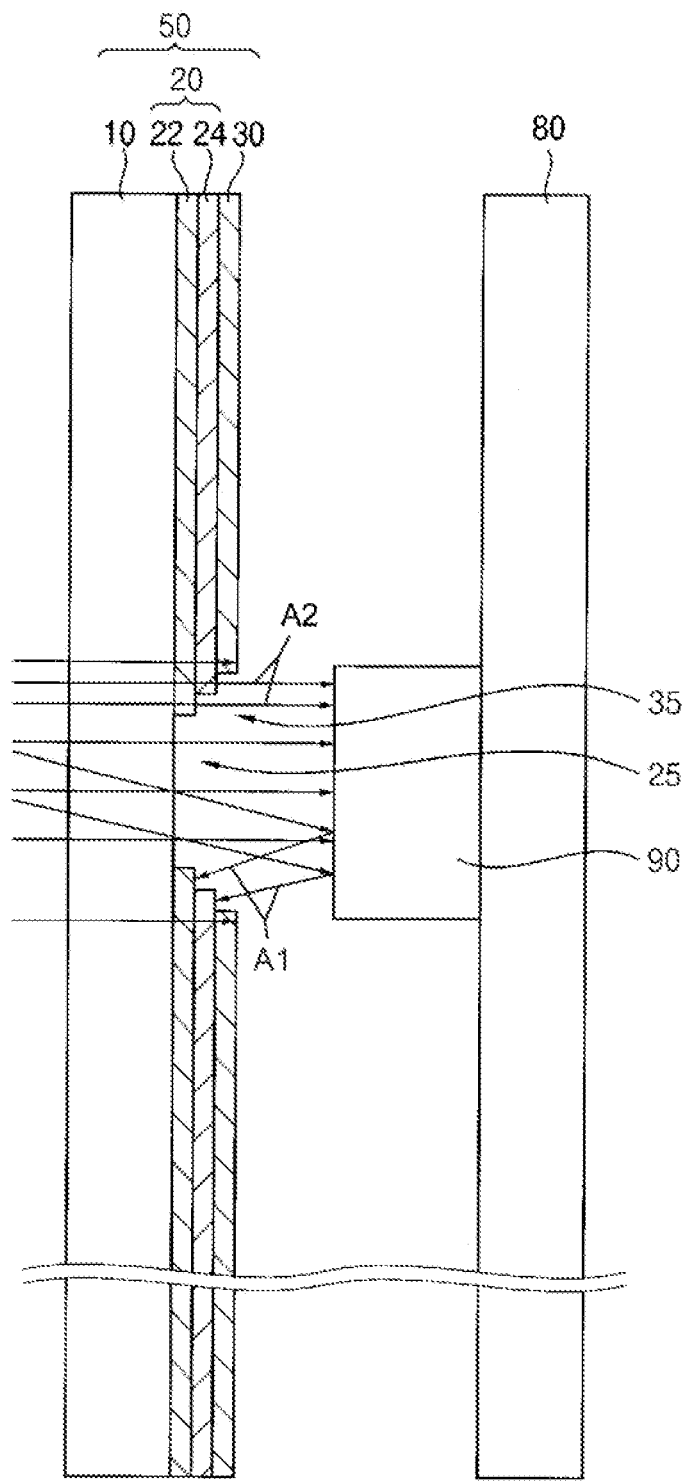
FIG. 1 is a cross sectional view illustrating a window structure of a comparative example.

The exemplary embodiments are described more fully hereinafter with reference to the accompanying drawings. The invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of an exemplary embodiment.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular an exemplary embodiment only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

An exemplary embodiment are described herein with reference to cross sectional illustrations that are schematic illustrations of illustratively idealized an exemplary embodiment (and intermediate structures) of the invention. As such, variations from the shapes of the illustrations as a result, for example, of manufacturing techniques and/or tolerances, are to be expected. Thus, an exemplary embodiment should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
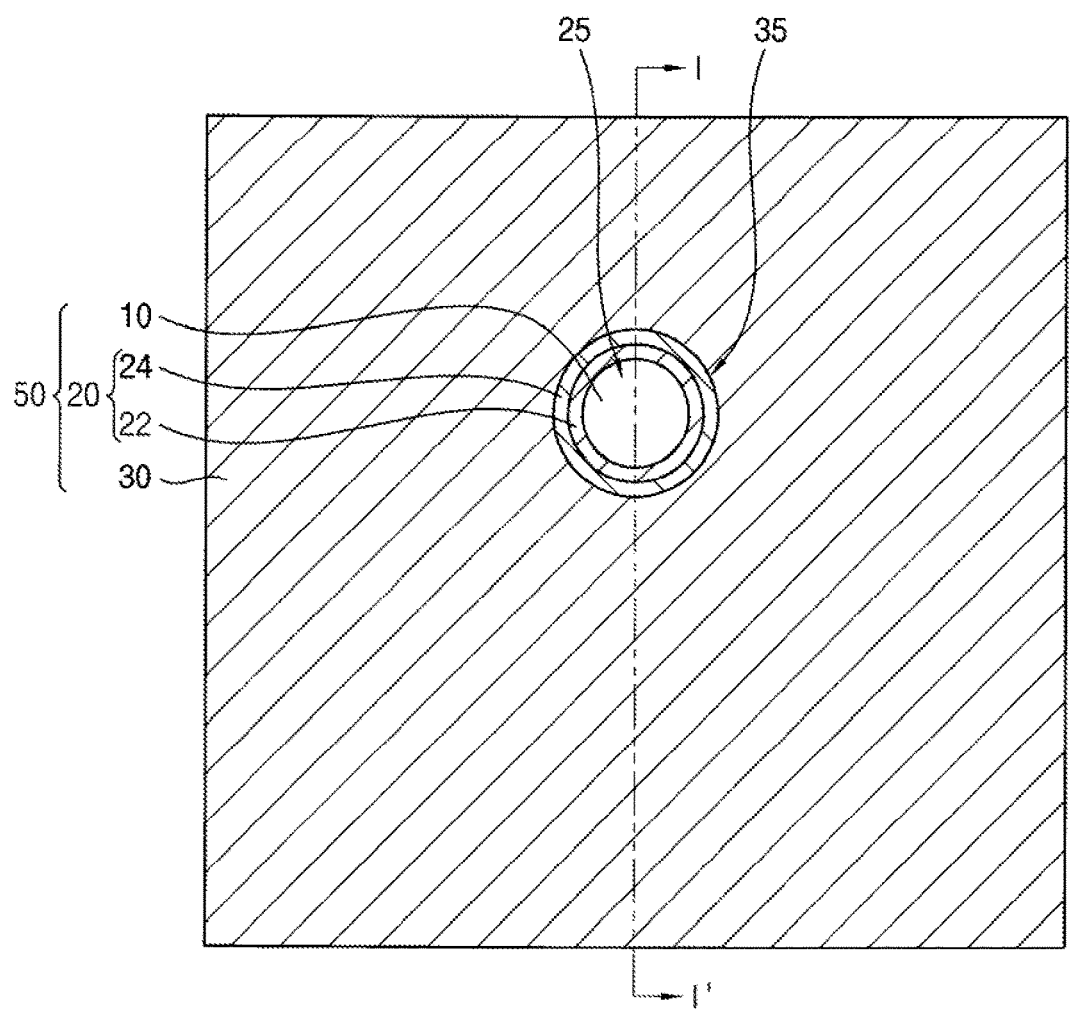
FIG. 2 is a plan view of the window structure of FIG. 1.

Turning now to FIGS. 1 and 2, FIG. 1 is a cross sectional view illustrating a window structure of a comparative example, and FIG. 2 is a plan view of the window structure of FIG. 1. FIG. 1 a cross-sectional view of the window structure of FIG. 2 cut along the line I-I'. In FIG. 1, a camera sensor that may be disposed facing the window structure is also shown.

Referring now to FIGS. 1 and 2, a window structure 50 may include a window 10 and a design layer structure 20 and a light shield layer 30 sequentially stacked on the window 10. The design layer structure 20 may include a first design layer 22 and a second design layer 24 sequentially stacked on the window 10, which is a transparent material, e.g., glass, plastic, etc. The first and second design layers 22 and 24 may have a chromatic color or a white color. The design layer structure 20 may have a first hole 25 exposing a top surface of the window 10. Accordingly, as the design layer structure 20 includes the first and second design layers 22 and 24, the first hole 25 may have a step shape of which a diameter may increase from a bottom portion adjacent to the top surface of the window 10 to a top portion distant from the top surface of the window 10. The first hole 25 may have a circular shape when view from a top side.

The light shield layer 30 may have a black color or a gray color. The light shield layer 30 may have a second hole 35 in fluid communication with the first hole 25, and the second hole 35 may have a diameter larger than that of the first hole 25. The second hole 35 may have a circular shape when viewed from a top side. The first and second holes 25 and 35 may be concentric circles.

A camera sensor 90 may be disposed facing the first and second holes 25 and 35, and the camera sensor 90 may be disposed on a substrate 80. A light that is reflected from an object (not shown) and passes through the window 10 and the first hole 25 of the design layer structure 20 may be incident on the camera sensor 90, and a portion of the light may be reflected from the camera sensor 90 and be incident on the light shield layer 30 and the design layer structure 20. A portion of the light incident on the design layer structure 20 may be reflected again (see rays A1 of FIG. 1) and be incident on the camera sensor 90. Thus, the camera sensor 90 may detect a color of the design layer structure 20 regardless of a color of the object.

If the design layer structure 20 has a very thin thickness, the portion of the light that is reflected from the object, passes through the window 10 and is incident on the design layer structure 20 may pass through the design layer structure 20 (see rays A2 of FIG. 1), and in this case the camera sensor 90 may also detect the color of the design layer structure 20. However, a light that is incident on a portion of the design layer structure 20 covered by the light shield layer 30 may not pass through the light shield layer 30, and thus may not be incident on the camera sensor 90.

As a result, a light having passed through the window 10 may be reflected diffusely at the design layer structure 20 not covered by the light shield layer 30, and the color of the design layer structure 20 that is not related to the color of the object may be detected by the camera sensor 90. Accordingly, the color of the design layer structure 20 may be transferred to surroundings of the image of the object, i.e., a kind of vignette may occur.

Figure 3:
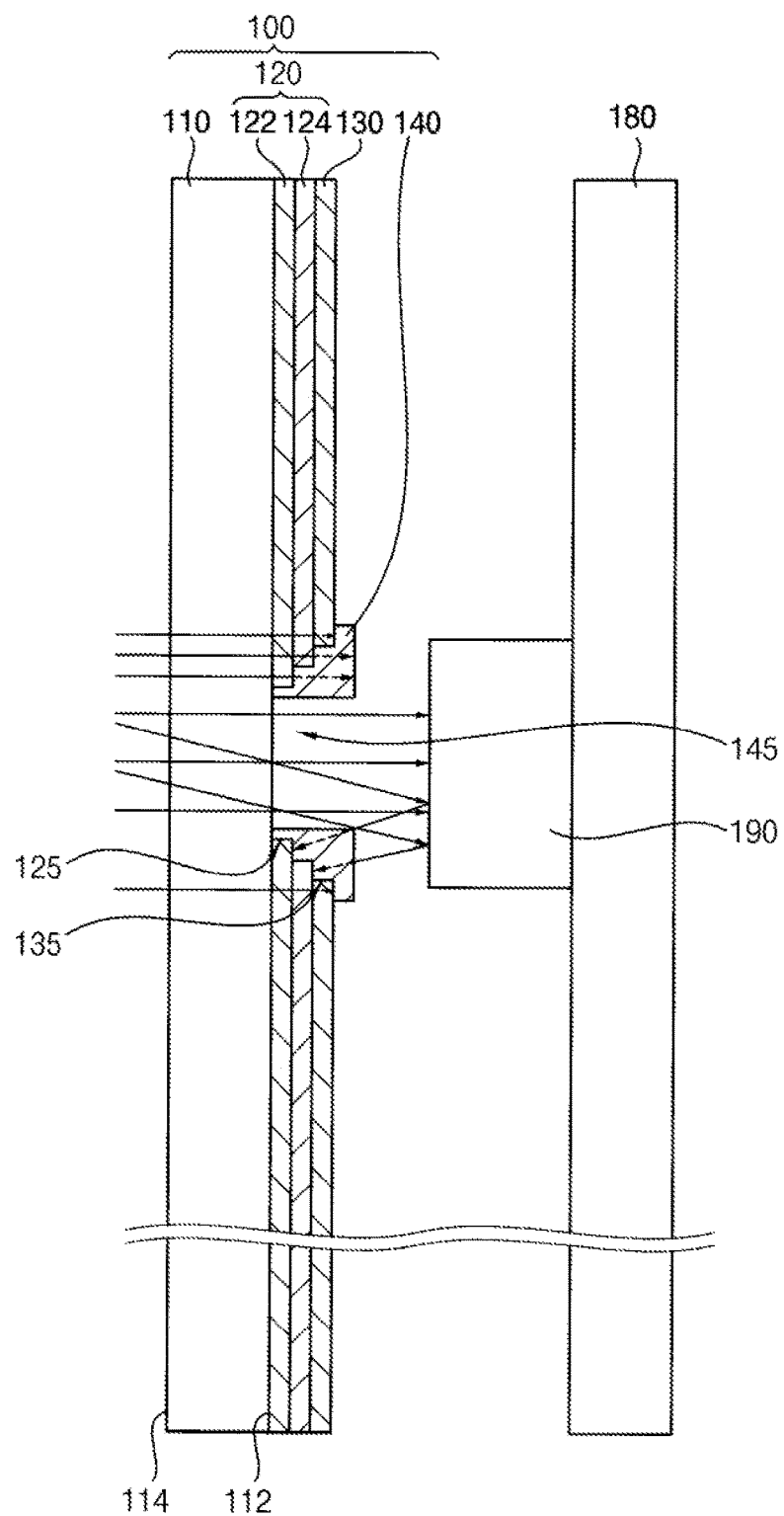
FIG. 3 is a cross sectional view illustrating a window structure in accordance with an exemplary embodiment.
Figure 4:
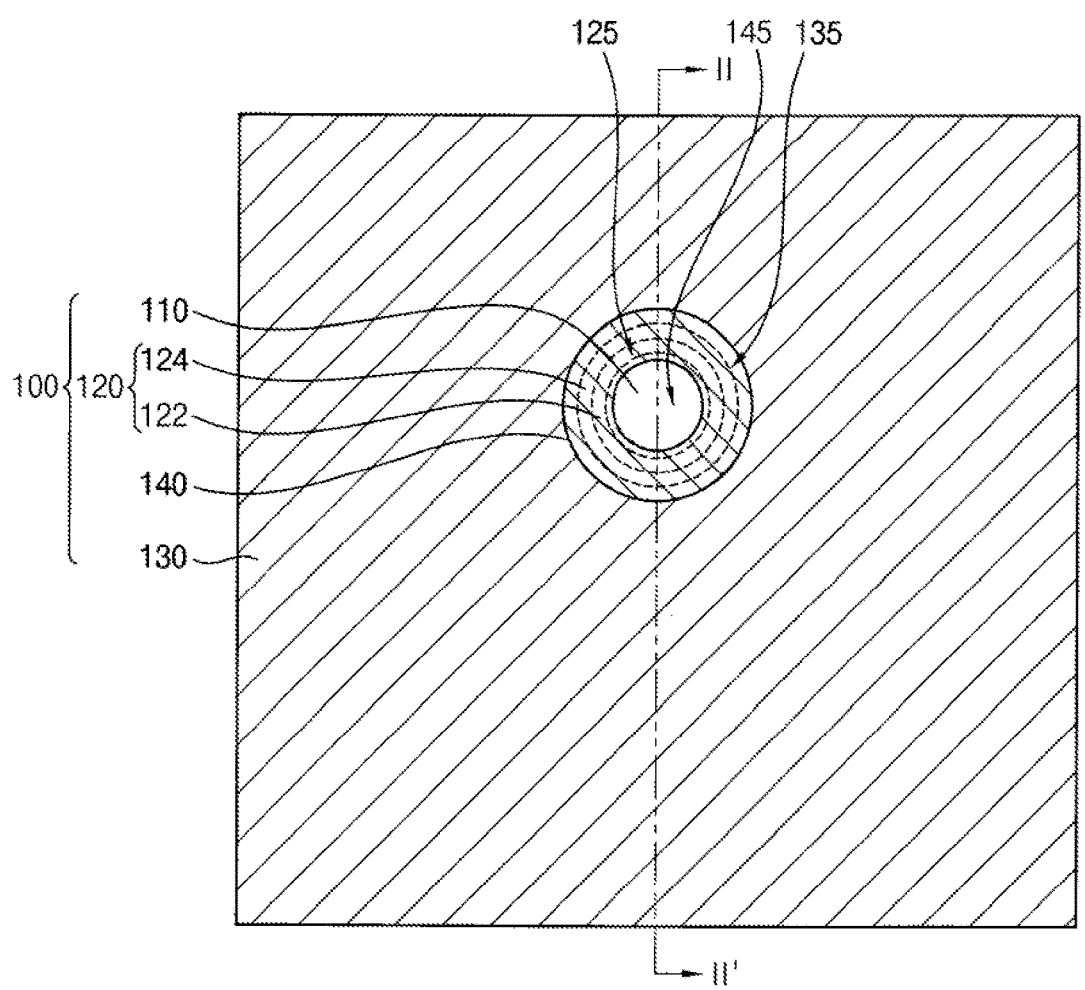
FIG. 4 is a plan view of the window structure of FIG. 3.

Turning now to FIGS. 3 and 4, FIG. 3 is a cross sectional view illustrating a window structure in accordance with an exemplary embodiment, and FIG. 4 is a plan view of the window structure of FIG. 3. FIG. 3 is a cross-sectional view of the window structure of FIG. 4 cut along the line II-II' of FIG. 4. In FIG. 3, a camera sensor that may be disposed facing the window structure is also shown.

Referring now to FIGS. 3 and 4, a window structure 100 may include a window 110, a first design layer structure 120 and a first light shield layer 130 sequentially stacked on the window 110, and a first light absorption layer 140. The window 110 may be a flat plate, and have a first surface 112 and a second surface 114 opposing the first surface 112. The window 110 may include a light transmission material, e.g., a synthetic resin such as acryl, or glass.

The first design layer structure 120 may be formed on the first surface 112 of the window 110. In an exemplary embodiment, the first design layer structure 120 may include a first design layer 122 and a second design layer 124 sequentially stacked on the window 110. The first and second design layers 122 and 124 may have a chromatic color or a white color. In an exemplary embodiment, the first and second design layers 122 and 124 may have substantially the same color.

The first design layer structure 120 may have a first hole 125 exposing a portion of the first surface 112 of the window 110. In an exemplary embodiment, the first hole 125 may have a circular shape when viewed from a top side. Accordingly, as the first design layer structure 120 includes the first and second design layers 122 and 124, the first hole 125 may have a step shape of which a diameter may increase from a bottom portion adjacent to the first surface 112 of the window 110 to a top portion distant from the first surface 112 of the window 110. That is, the second design layer 124 may not cover the whole first design layer 122, and thus the first design layer 122 may be partially exposed.

FIGS. 3 and 4 show the first design layer structure 120 having the two design layers 122 and 124 sequentially stacked, however, the first design layer structure 120 may have more than two design layers, and the first hole that may be defined as a sidewall and/or a top surface of the design layers may also have a step shape of which a diameter may increase from a bottom portion adjacent to the first surface 112 of the window 110 to a top portion distant from the first surface 112 of the window 110. Alternatively, the first design layer structure 120 may have only one design layer. Hereinafter, for the convenience of explanation, only the case in which the first design structure 120 has two design layers will be illustrated.

The first light shield layer 130 may have a black color or a gray color and be formed on the second design layer 124 of the first design layer structure 120, and have a second hole 135 in fluid communication with the first hole 125. In an exemplary embodiment, the second hole 135 may have a diameter larger than that of the first hole 125. The second hole 135 may have a circular shape when viewed from a top side. The first and second holes 125 and 135 may be concentric circles. The first light shield layer 130 may not cover the whole second design layer 124, and thus the second design layer 124 may be partially exposed. Thus, a hole structure including the first and second holes 125 and 135 may have a step shape of which a diameter may increase from a bottom portion adjacent to the first surface 112 of the window 110 to a top portion distant from the first surface 112 of the window 110.

The first light absorption layer 140 may cover at least a portion of the first design layer structure 120 exposed by the first hole structure, i.e., the first and second holes 125 and 135, and may have a third hole 145 exposing a portion of the first surface 112 of the window 110. That is, the first light absorption layer 140 may cover a sidewall of the first design layer 122, a portion of a top surface of the first design layer 122 and a sidewall of the second design layer 124, which may be exposed by the first hole 125 or may define the first hole 125, and a portion of a top surface of the second design layer 124 exposed by the second hole 135. The third hole 145 may be formed within the first hole structure consisting of the first and second holes 125 and 135 and may have a diameter that is smaller than that of the first hole structure. In an exemplary embodiment, the third hole 145 and the first hole 125 and/or the second hole 135 may be concentric circles when viewed from a top side. In an exemplary embodiment, the third hole 145 may have a sidewall substantially perpendicular to the first surface 112 of the window 110. That is, the first light absorption layer 140 may have a sidewall substantially perpendicular to the first surface 112 of the window 110.

In an exemplary embodiment, the first light absorption layer 140 may cover not only a portion of the first design layer structure 120, but also a sidewall of the first light shield layer 130, which may be exposed by the second hole 135 or may define the second hole 135, and a portion of a top surface of the first light shield layer 130 adjacent to the second hole 135. A boundary of the first light absorption layer 140 may be a circle, and the first and second holes 125 and 135 and the boundary of the first light absorption layer 140 may be concentric circles. In an exemplary embodiment, the first light absorption layer 140 may have a top surface substantially parallel to the first surface 112 of the window 110. The first light absorption layer 140 may have a black color or a gray color. In an example embodiment, the first light shield layer 130 may have a gray color and the first light absorption layer 140 may have a black color.

In FIG. 4, the first design layer structure 120 and the first light shield layer 130 cover entirely the first surface 112 of the window 110 except for the first to third holes 125, 135 and 145, however, the first design layer structure 120 and the first light shield layer 130 may be formed only at a portion of the first surface 112 of the window 110 adjacent to the first light absorption layer 140 according to a desired design.

A camera sensor 190 may be disposed facing the third hole 145, and the camera sensor 190 may be disposed on a substrate 180. Accordingly, the third hole 145 may serve as a path through which a light reflected from an object (not shown) may pass.

A light that is reflected from the object and passes through the window 110 and the third hole 145 may be incident on the camera sensor 190, and a portion of the light may be reflected from the camera sensor 190 and toward the first design layer structure 120, the shield layer 130 or the first light absorption layer 140. However, the first light absorption layer 140 may cover portions of the first design layer structure 120 exposed by the first and second holes 125 and 135, and thus light reflected off the camera sensor 190 may be blocked from being incident on the first design layer structure 120 by the first light absorption layer 140 and the first light shield layer 130. Thus, the color of the first design layer structure 120, which may be chromatic or white, may not be detected by the camera sensor 190.

Even though the first design layer structure 120 may have a very thin thickness, a light that is reflected from the object, passes through the window 110 and the first design layer structure 120, and is incident on the first hole 125 or the second hole 135 may be absorbed by the first light absorption layer 140, so that the light may not be incident on the camera sensor 190. A light that passes through the window 110 and is incident on a portion of the first design layer structure 120 covered by the first light shield layer 130 may also be blocked by the first light shield layer 130, so that the light that interacts with first design layer structure 120 does not reach camera sensor 190.

Accordingly, the color of the first design layer structure 120 that is not related to the color of the object may be prevented from being incident on the camera sensor 190, and the vignetting, i.e., the color of the first design layer structure 120 that would otherwise be transferred to surroundings of the image of the object, may be prevented.

Figure 5:
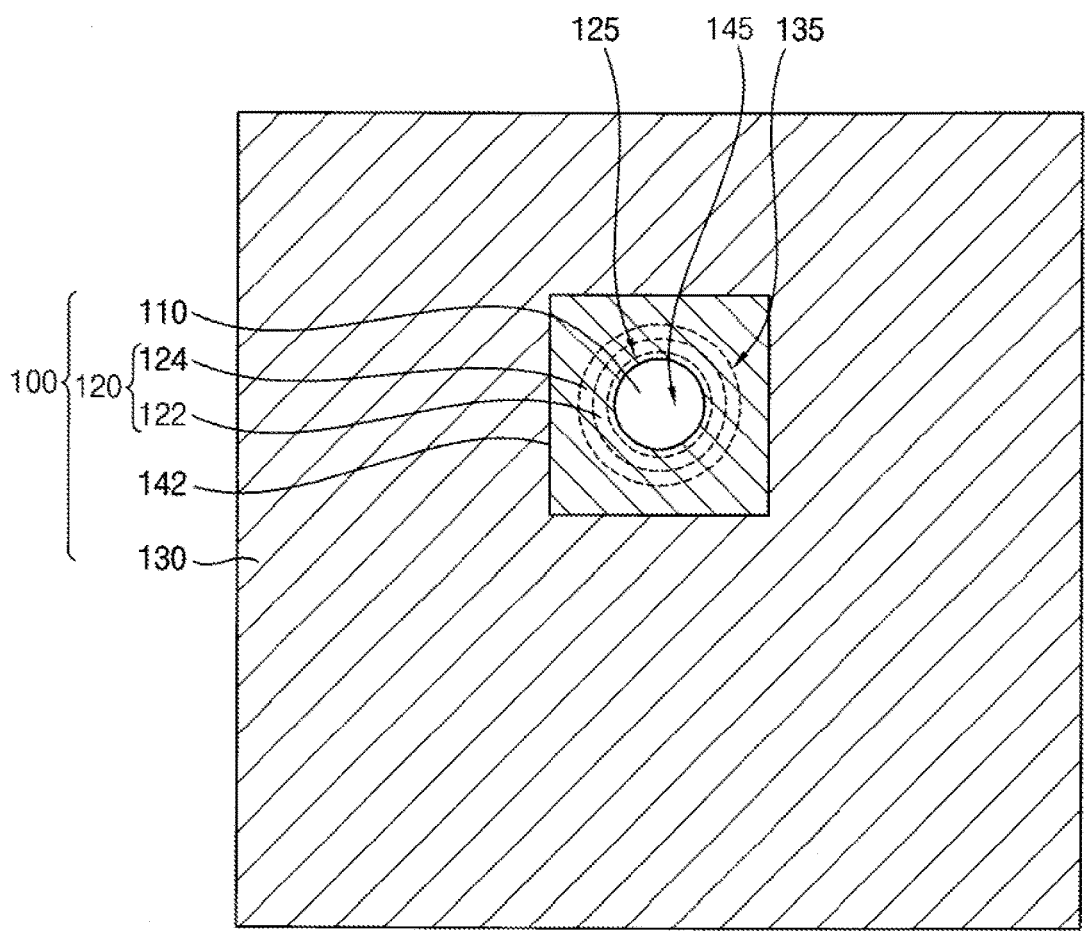
FIG. 5 is a plan view illustrating a window structure in accordance with an exemplary embodiment.

Turning now to FIG. 5, FIG. 5 is a plan view illustrating a window structure in accordance with an exemplary embodiment. The window structure may be substantially the same as that of FIGS. 3 and 4, except for the boundary of the light absorption layer 140. Thus, like reference numerals refer to like elements, and detailed descriptions thereon are omitted herein.

A window structure 100 may include a window 110, a first design layer structure 120 and a first light shield layer 130 sequentially stacked on the window 110, and a second light absorption layer 142. In an exemplary embodiment, the second light absorption layer 142 may have a rectangular shaped boundary.

The window structure 100 may have other types of boundary, e.g., an ellipse, polygon, etc., except for the circle or the rectangle of the first and second light absorption layers 140 and 142, respectively. Hereinafter only the window structure having the boundary of circle will be illustrated for the convenience of explanation.

Turning now to FIGS. 6-13, FIGS. 6, 8, 10 and 12 are cross-sectional views illustrating a method of manufacturing a window structure in accordance with an exemplary embodiment, and FIGS. 7, 9, 11 and 13 are plan views of the window structure thereof. More specifically, FIGS. 6, 8, 10 and 12 are cross-sectional views of the window structure of FIGS. 7, 9, 11 and 13, respectively, cut along the line III-III' of FIGS. 7, 9, 11 and 13. FIGS. 6 to 13 show a method of manufacturing the window structure of FIGS. 3 and 4, however, these may not be limited thereto.

Figure 6:
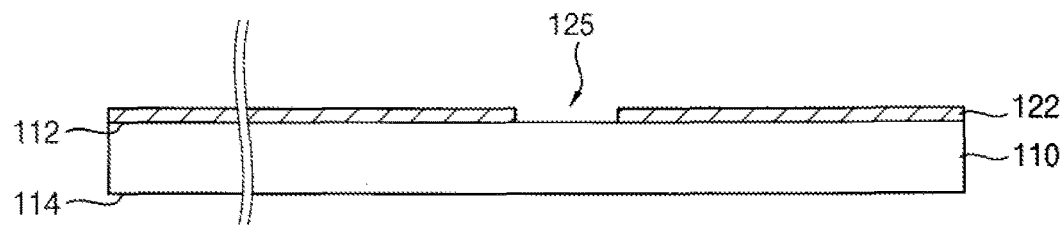
FIGS. 6, 8, 10 and 12 are cross-sectional views illustrating a method of manufacturing a window structure in accordance with an exemplary embodiment.
Figure 7:
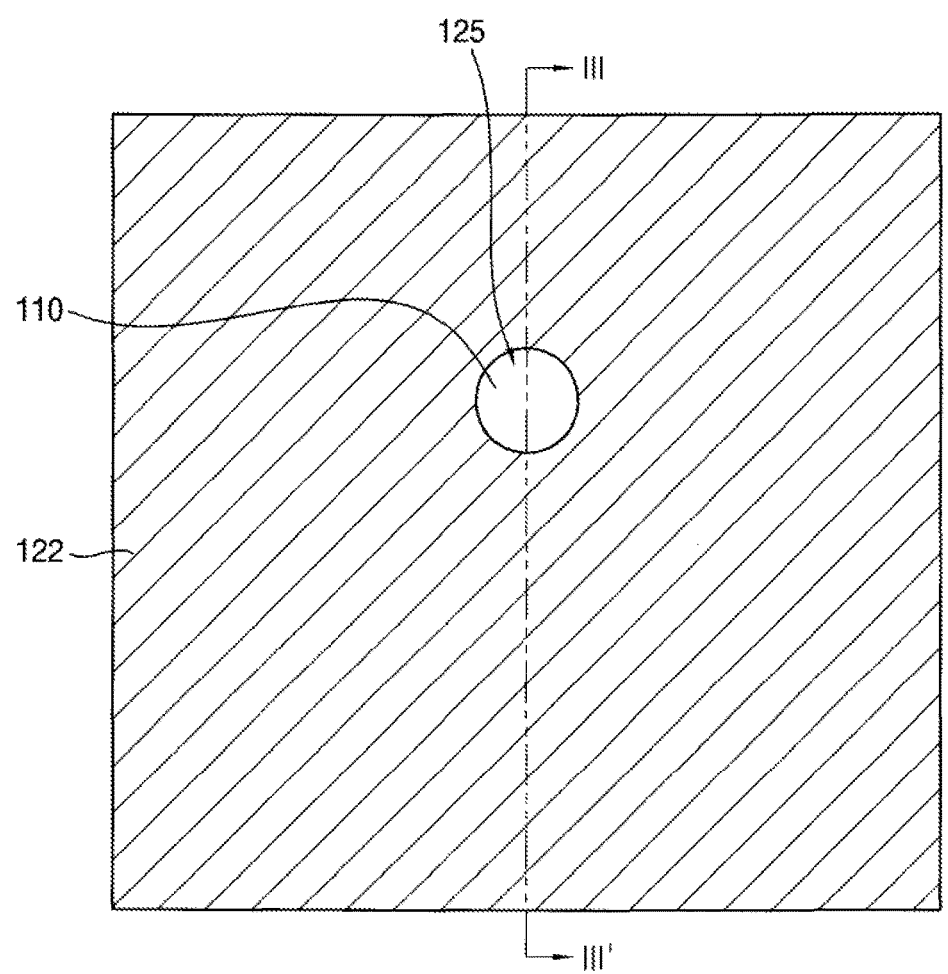
FIGS. 7, 9, 11 and 13 are plan views of the window structure thereof.

Referring now to FIGS. 6 and 7, the window 110 may include a light transmission material, e.g., a synthetic resin such as acryl, or glass. The window 110 may include a first surface 112 and a second surface 114 opposing the first surface 112.

The first design layer 122 may be formed on the first surface 112 of the window 110. In an exemplary embodiment, the first design layer 122 may be formed by a screen printing process using a mesh. That is, a mesh (not shown) for forming a desired pattern may be mounted on the first surface 112 of the window 110, ink may be sprayed or dropped onto the mesh, and a rubber plate may press the sprayed or dropped ink to form the first design layer 122 having a desired pattern. In an exemplary embodiment, the first design layer 122 may be formed using ink of a chromatic color or a white color, and a metal powder, e.g., silver powder may be included in the ink.

In an exemplary embodiment, the first design layer 122 may be formed to include a first hole 125 therethrough. The first hole 125 may have a circular shape when viewed from a top side. A drying process may be further performed after the first design layer 122 is printed on the first surface 112 of the window 110.

Figure 8:
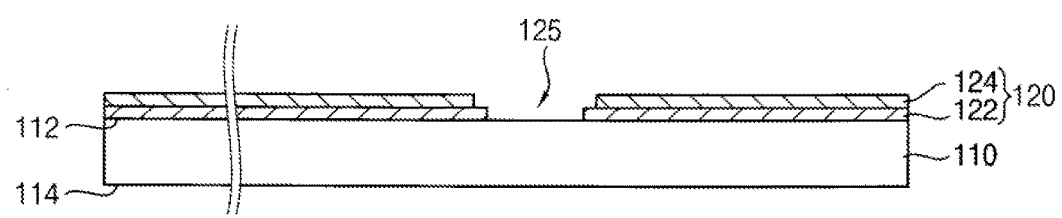
Figure 9:
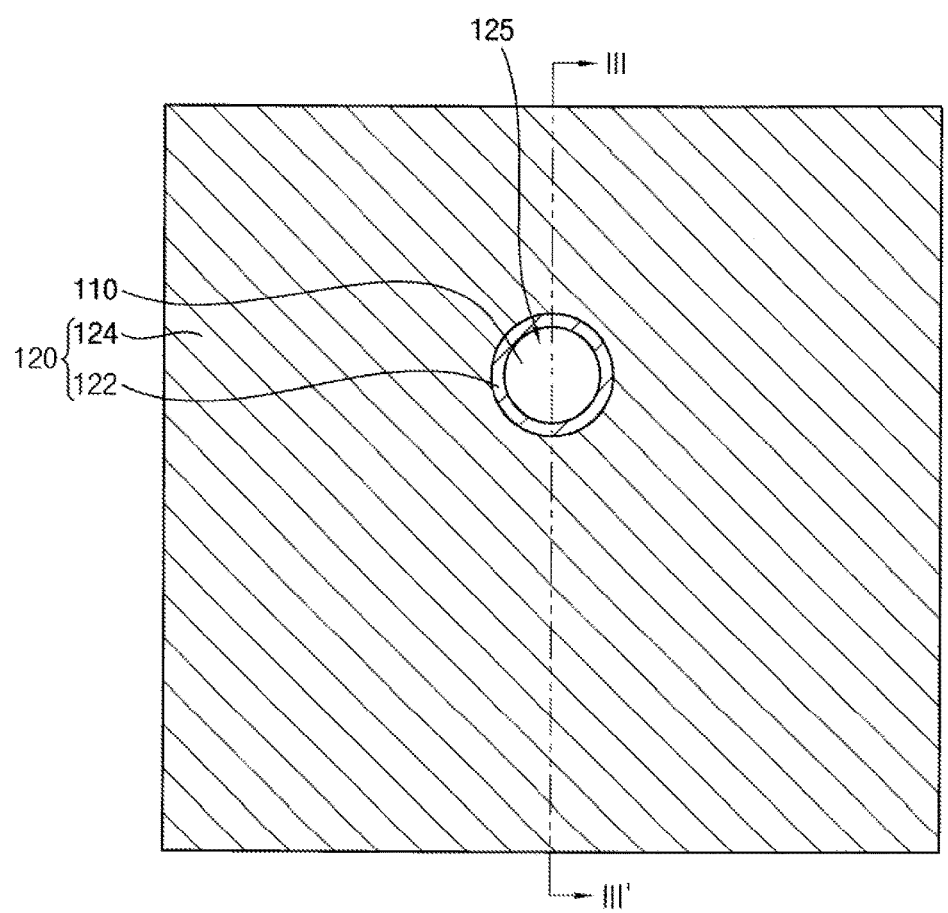

Referring now to FIGS. 8 and 9, a second design layer 124 may be formed on the first design layer 122. The second design layer 124 may be formed by a screen printing process using a mesh as with the first design layer 122. In an exemplary embodiment, the second design layer 124 may be formed using chromatic or white ink, and may be formed using ink having substantially the same color as that of the first design layer 122.

In an exemplary embodiment, the second design layer 124 may be formed to have a hole therethrough. The hole in second design layer 124 and the first hole 125 may be concentric circles. Thus, the hole in second design layer 124 may be in fluid communication with the first hole 125.

In an exemplary embodiment, the hole in second design layer 124 may be formed to have a diameter larger than that of the first hole 125 in order for the second design layer 124 may not be formed on a portion of the first surface 112 of the window 110 exposed by the first hole 125 during the screen printing process. Thus, the first design layer 122 may not be completely covered by the second design layer 124, and a portion of the first design layer 122 adjacent to the first hole 125 may be exposed.

Hereinafter, the first hole 125 through the first design layer 122 together with the hole through the second design layer 124 in fluid communication therewith may be referred to as the first hole 125. A bottom of the first hole 125 may be defined by a portion of the first surface 112 of the window 110 not covered by the first design layer 122, and a sidewall of the first hole 125 may be defined by a sidewall and the exposed portion of a top surface of the first design layer 122, and a sidewall of the hole in the second design layer 124. Accordingly, the first hole 125 may have a step shape of which a diameter may increase from a bottom portion adjacent to the first surface 112 of the window 110 to a top portion distant from the first surface 112 of the window 110.

The first and second design layers 122 and 124 may define a first design layer structure 120. As described above, the first design layer structure 120 may instead be formed to include more than two design layers sequentially stacked, or may not include the second design layer 124 but include only the first design layer 122.

Figure 10:
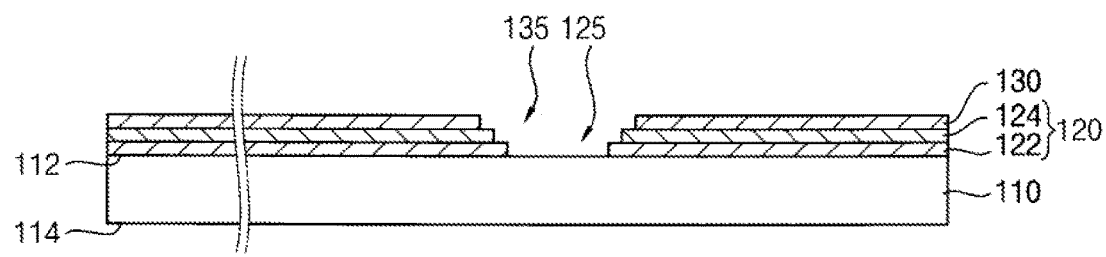
Figure 11:
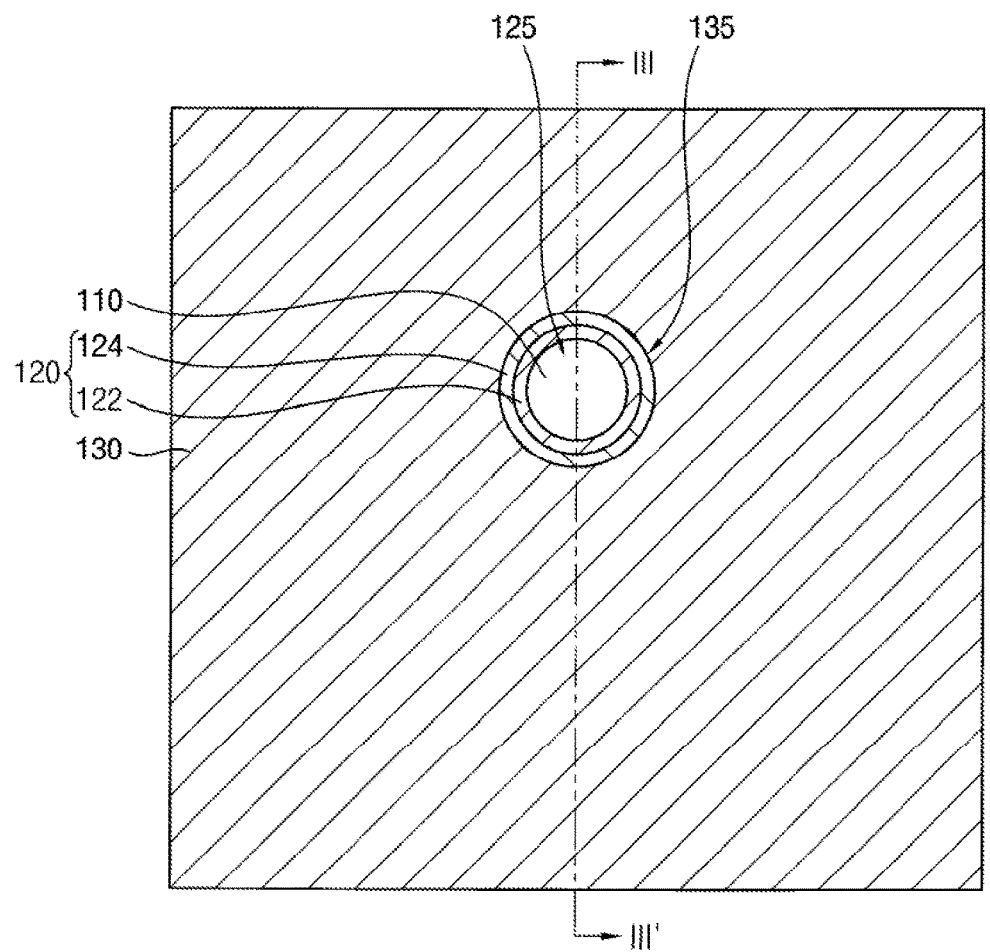

Referring now to FIGS. 10 and 11, a first light shield layer 130 may be formed on a top surface of the first design layer structure 120, i.e., on a top surface of the second design layer 124.

The first light shield layer 130 may be formed by a screen printing process using a mesh as with the first and second design layers 122 and 124. In an exemplary embodiment, the first light shield layer 130 may be formed using black ink or gray ink.

In an exemplary embodiment, the first light shield layer 130 may be formed to have a second hole 135 therethrough. The second hole 135 may have a circular shape when viewed from a top side. In an exemplary embodiment, the second hole 135 and the first hole 125 may be concentric circles. Thus, the first and second holes 125 and 135 may be in fluid communication with each other.

In an exemplary embodiment, the second hole 135 may be formed to have a diameter larger than that of the first hole 125 so that the first light shield layer 130 may not be formed on the portion of the first surface 112 of the window 110 exposed by the first hole 125. Accordingly, the second design layer 124 may not be completely covered by the first light shield layer 130, and a portion of a top surface of the second design layer 124 adjacent to the first hole 125 may be exposed.

Hereinafter, the first hole 125 together with the second hole 135 in fluid communication therewith may be referred to as a first hole structure. A sidewall of the first hole structure may be defined by the sidewall of the first hole 125, the exposed portion of the top surface of the second design layer 124 adjacent to the first hole 125, and a sidewall of the first light shield layer 130. Thus, the first hole structure may have a step shape of which a diameter may increase from a bottom portion adjacent to the first surface 112 of the window 110 to a top portion distant from the first surface 112 of the window 110.

Figure 12:
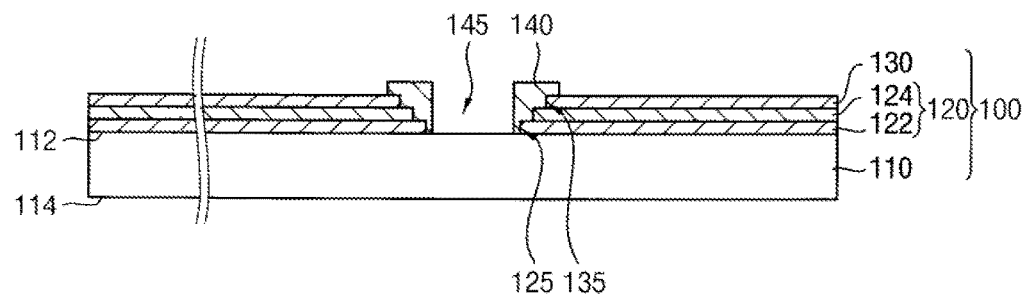
Figure 13:
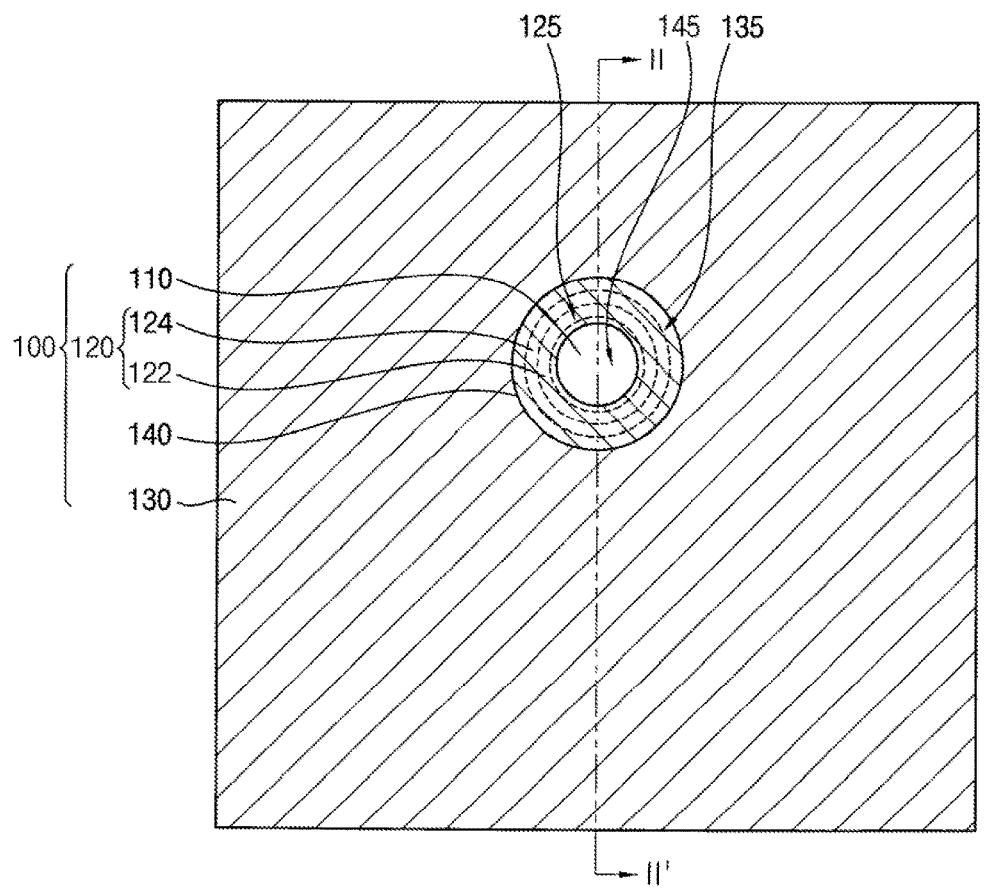

Referring now to FIGS. 12 and 13, a first light absorption layer 140 may be formed on the first surface 112 of the window 110 to cover at least exposed portions of the first design layer structure 120 exposed by the first hole structure, i.e., the first and second holes 125 and 135, and thus the window structure 100 may be manufactured.

The first light absorption layer 140 may be produced by a screen printing process using a mesh as with the design layers 122 and 124 and the first light shield layer 130. In an exemplary embodiment, the first light absorption layer 140 may be formed using black ink or gray ink.

In an exemplary embodiment, the first light absorption layer 140 may have a circular shape when viewed from a top side, and may have a third hole 145 exposing a portion of the first surface 112 of the window 110. As described above, the first light absorption layer 140 may instead be formed to have other types of shape, e.g., an ellipse, polygon, etc.

In an exemplary embodiment, the first light absorption layer 140 may cover at least the sidewall of the first design layer 122, a portion of a top surface of the first design layer 122 and a sidewall of the second design layer 124 that may be exposed by or defining the first hole 125, and a portion of a top surface of the second design layer 124 exposed by the second hole 135. Further, the first light absorption layer 140 may cover a sidewall of the first light absorption layer 130 exposed by or defining the second hole 135 and a portion of a top surface of the first light shield layer 130 adjacent to the second hole 135.

The third hole 145 may be formed within the first hole structure to have a diameter smaller than that of the first hole structure, and the third hole 145 and the first hole 125 and/or the second hole 135 may be concentric circles. In an exemplary embodiment, the third hole 145 may be formed to have a sidewall substantially perpendicular to the first surface 112 of the window 110. That is, the first light absorption layer 140 may have a sidewall substantially perpendicular to the first surface 112 of the window 110. In an exemplary embodiment, the first light absorption layer 140 may be formed to have a top surface substantially parallel to the first surface 112 of the window 110.

Turning now to FIGS. 14-19, FIGS. 14 to 19 are cross-sectional views illustrating window structures in accordance with various exemplary embodiments. The window structures in FIGS. 14 to 19 may be substantially the same as or similar to that of FIGS. 3 and 4, except for the shape of the light absorption layer. Thus, like reference numerals refer to like elements, and detailed descriptions thereof are omitted herein.

Figure 14:
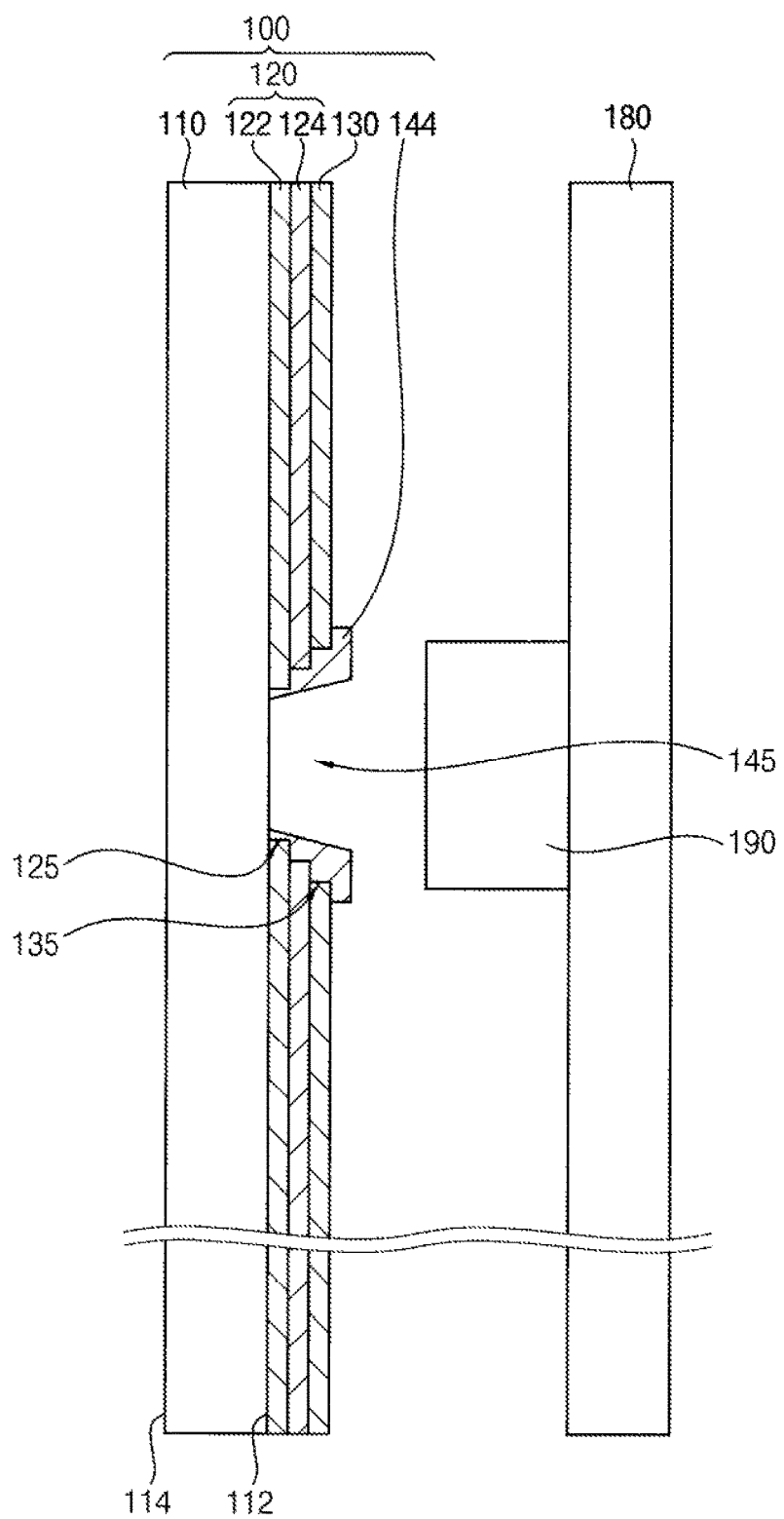
FIGS. 14 to 19 are cross-sectional views illustrating window structures in accordance with an exemplary embodiment.

Referring now to FIG. 14, a window structure 100 may include a window 110, a first design layer structure 120 and a first light shield layer 130 sequentially stacked on the window 110, and a third light absorption layer 144.

As with the previous embodiments, the third light absorption layer 144 may have a top surface substantially parallel to the first surface 112 of the window 110, but the third light absorption layer 144 may also have a sidewall that is not perpendicular to the first surface 112 of the window 110, but is instead slanted thereto. In particular, a third hole 145 of the third light absorption layer 144 may have a diameter that may gradually increase from a bottom portion adjacent to the first surface 112 of the window 110 to a top portion distant from the first surface 112 of the window 110. Thus, an amount of light that may be reflected from an object, pass through the window 110 and be incident on the camera sensor 190 may be relatively increased.

Figure 15:
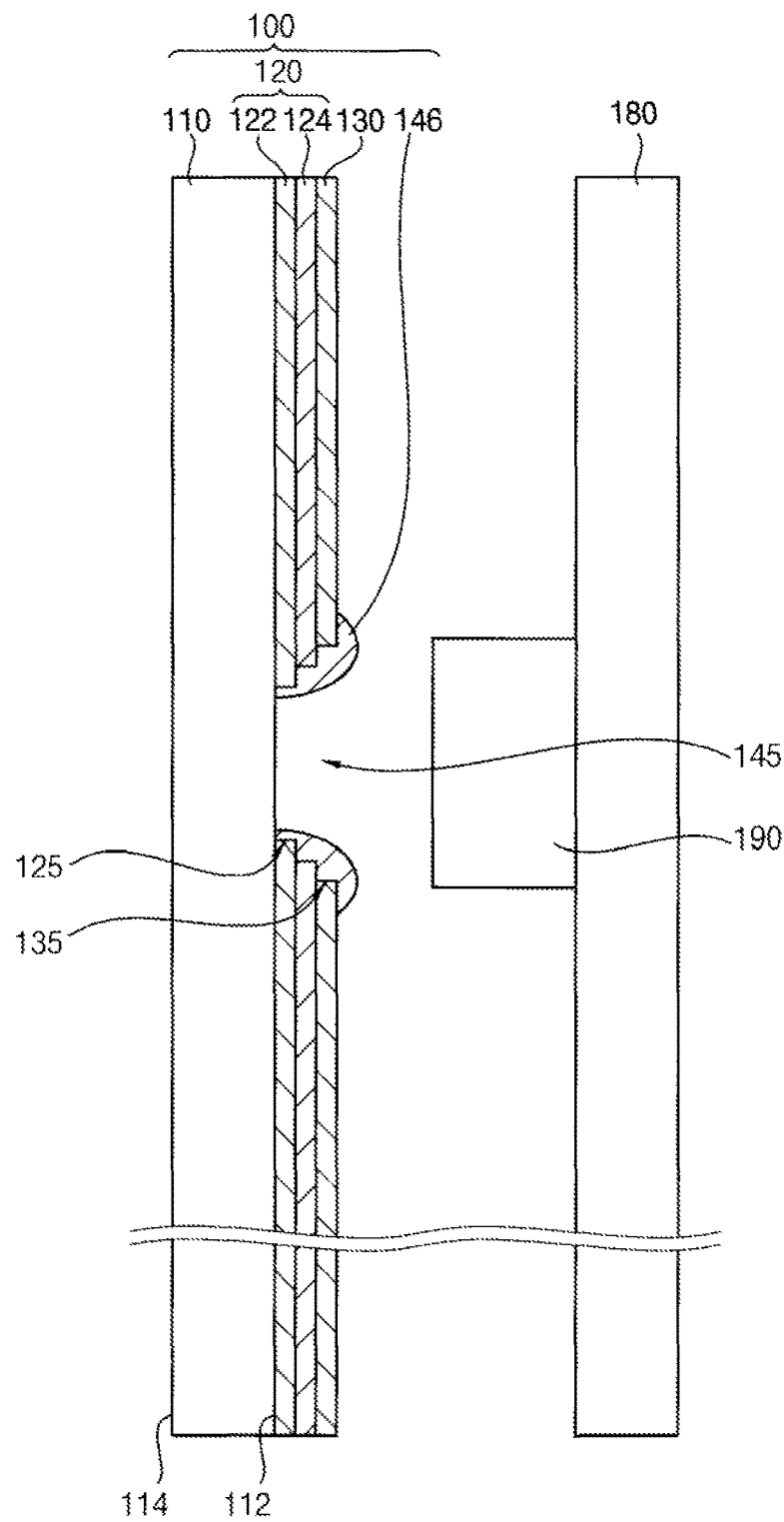

Referring now to FIG. 15, a window structure 100 may include a window 110, a first design layer structure 120 and a first light shield layer 130 sequentially stacked on the window 110, and a fourth light absorption layer 146. The fourth light absorption layer 146 may have a curved sidewall that forms various oblique angles with respect to the first surface 112 of the window 110. Furthermore, a top surface of fourth light absorption layer 146 is curved and is therefore not parallel to the first surface 112 of the window 110.

Figure 16:
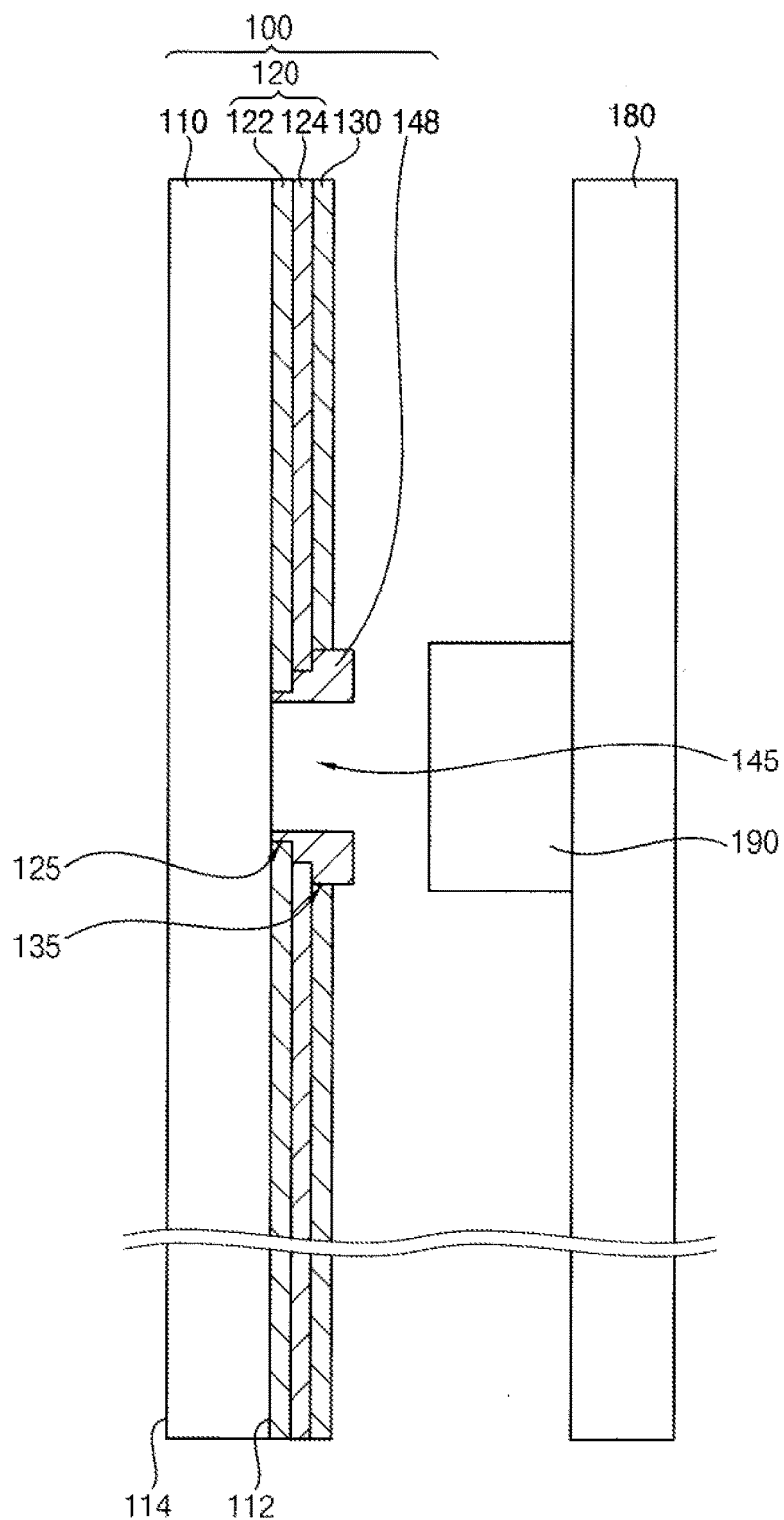

Referring now to FIG. 16, a window structure 100 may include a window 110, a first design layer structure 120 and a first light shield layer 130 sequentially stacked on the window 110, and a fifth light absorption layer 148.

The fifth light absorption layer 148 may have a sidewall substantially perpendicular to the first surface 112 of the window 110 and a top surface substantially parallel to the first surface 112 of the window 110, but does not cover a top surface of the first light shield layer 130. In an exemplary embodiment, the fifth light absorption layer 148 may have a top surface substantially higher than that of the first light shield layer 130.

Figure 17:
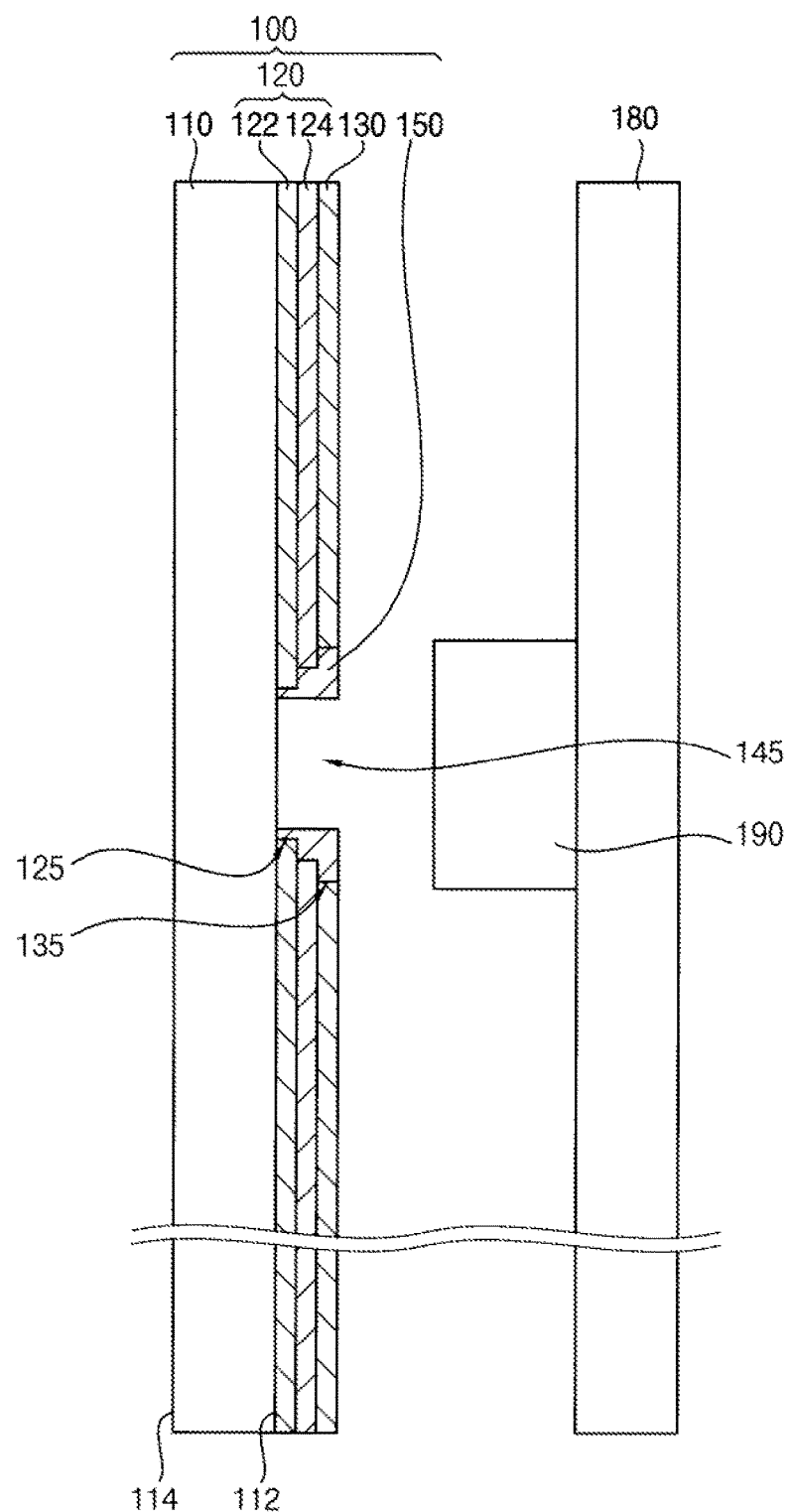

Referring now to FIG. 17, a window structure 100 may include a window 110, a first design layer structure 120 and a first light shield layer 130 sequentially stacked on the window 110, and a sixth light absorption layer 150. The sixth light absorption layer 150 may have a sidewall substantially perpendicular to the first surface 112 of the window 110 and a top surface substantially parallel to the first surface 112 of the window 110, and may be absent from a top surface of the first light shield layer 130 and be substantially coplanar with the top surface of the first light shield layer 130.

Figure 18:
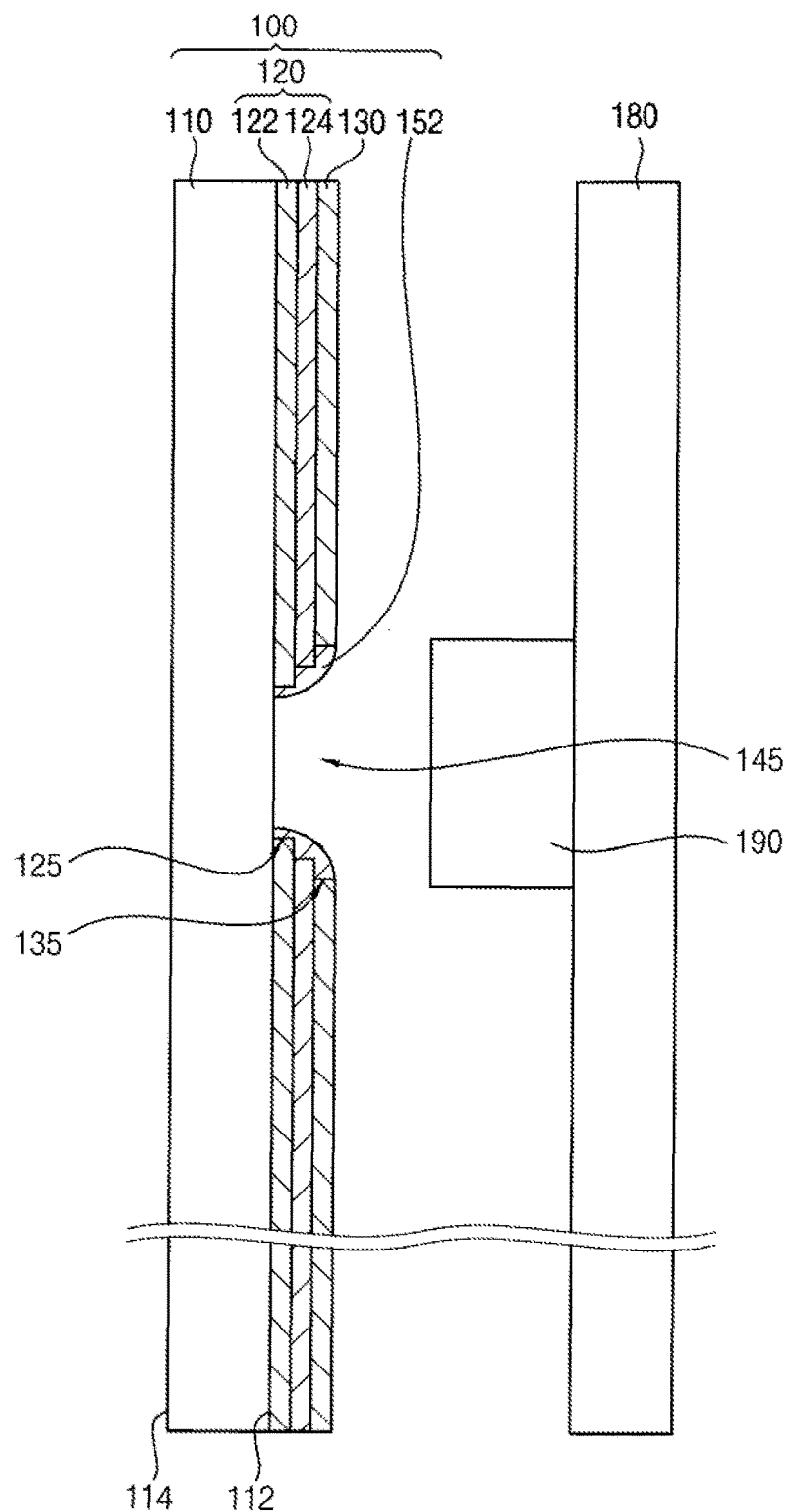

Referring now to FIG. 18, a window structure 100 may include a window 110, a first design layer structure 120 and a first light shield layer 130 sequentially stacked on the window 110, and a seventh light absorption layer 152. The seventh light absorption layer 152 may have a curved sidewall slanted with respect to the first surface 112 of the window 110, and may be absent from a top surface of the first light shield layer 130. In the exemplary embodiment of FIG. 18, the seventh light absorption layer 152 may have a top surface substantially coplanar with that of the first light shield layer 130.

Figure 19:
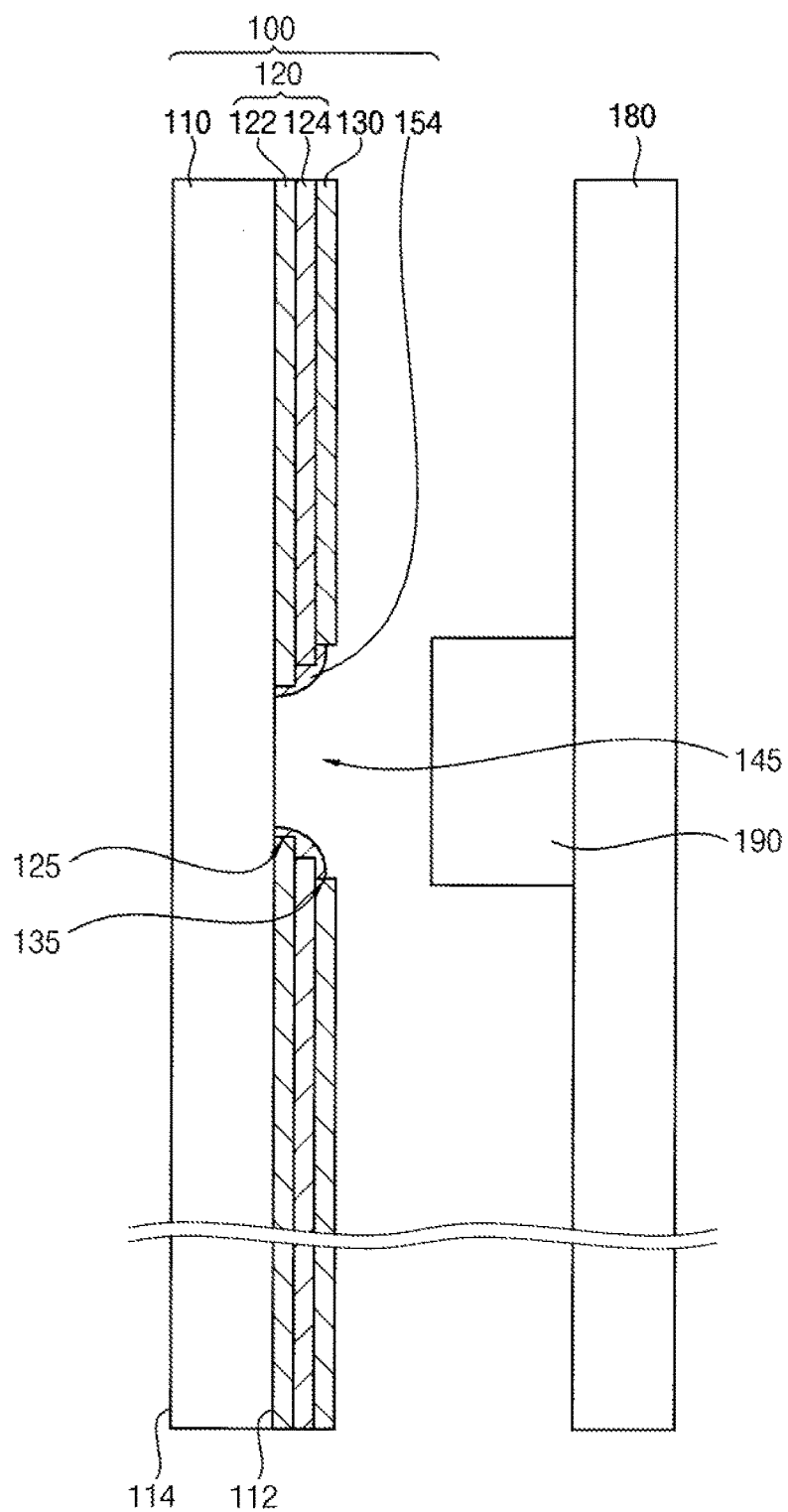

Referring now to FIG. 19, a window structure 100 may include a window 110, a first design layer structure 120 and a first light shield layer 130 sequentially stacked on the window 110, and a eighth light absorption layer 154. The eighth light absorption layer 154 may have a curved sidewall slanted with respect to the first surface 112 of the window 110, and may be absent from a top surface of the first light shield layer 130. In the exemplary embodiment of FIG. 19, the eighth light absorption layer 154 may have a top surface that is lower than that of the first light shield layer 130, and thus may cover only a portion of a sidewall of the first light shield layer 130.

Figure 20:
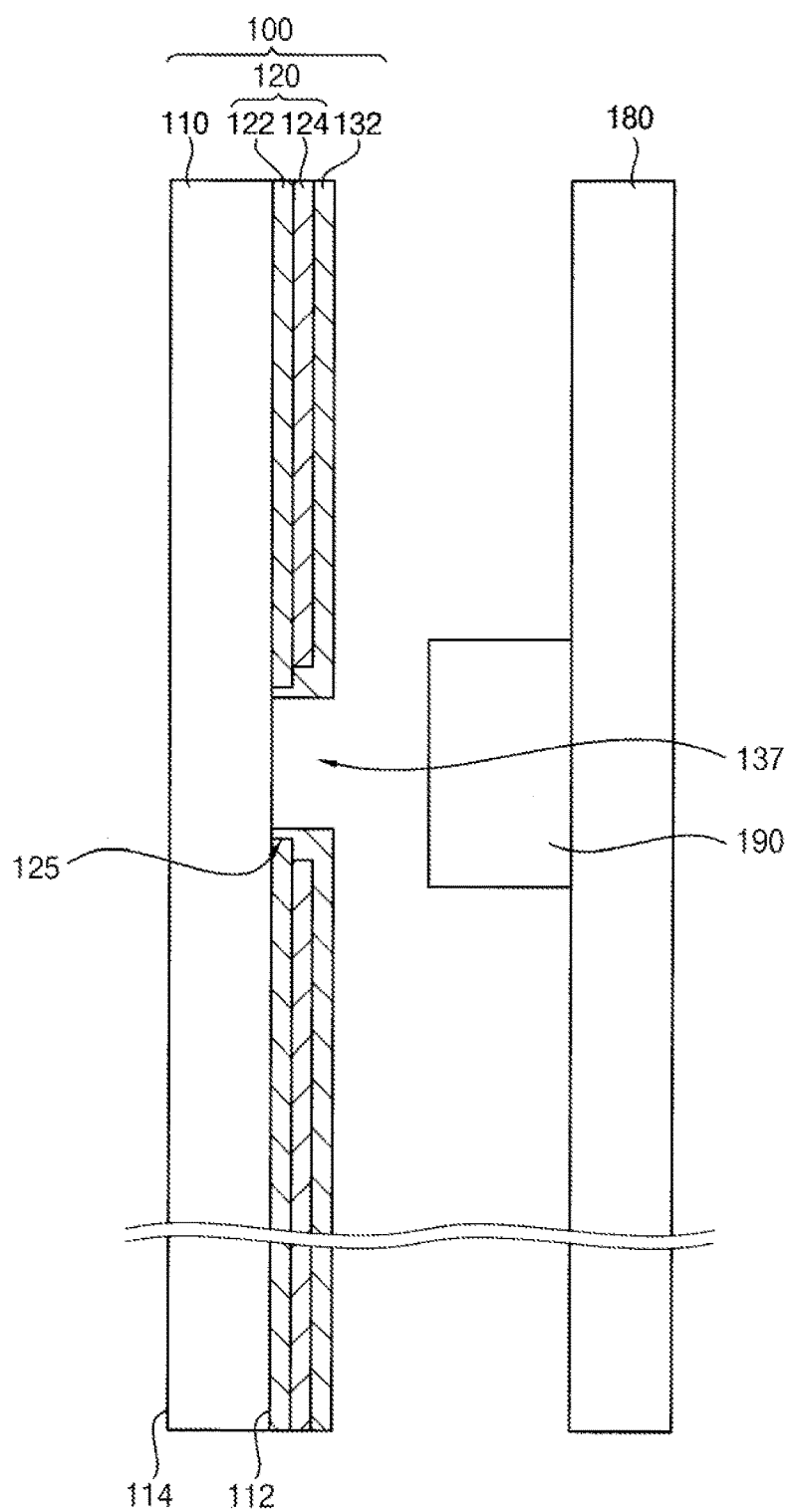
FIG. 20 is a cross-sectional view illustrating a window structure in accordance with an exemplary embodiment
Figure 21:
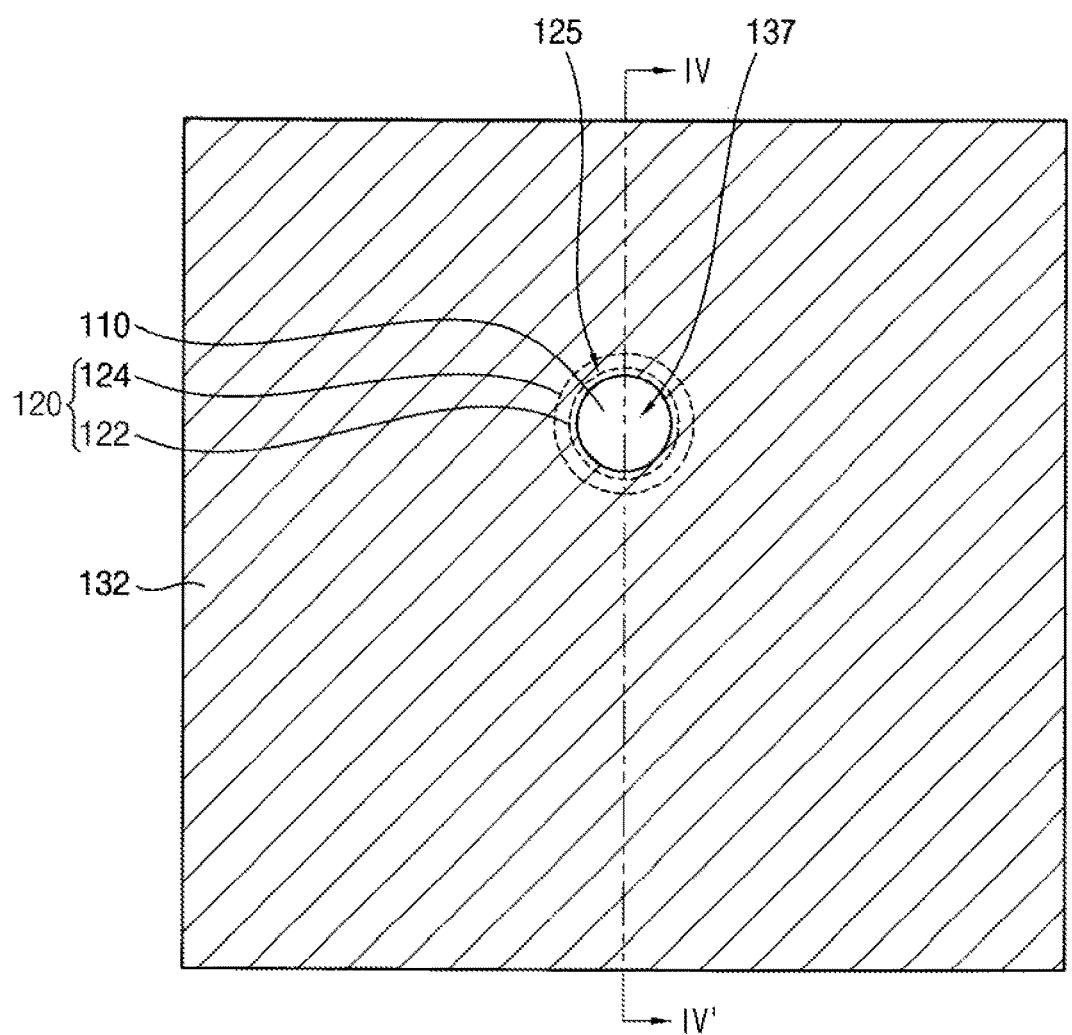
FIG. 21 is a plan view of the window structure of FIG. 20.

Turning now to FIGS. 20 and 21, FIG. 20 is a cross-sectional view illustrating a camera sensor facing a window structure in accordance with an exemplary embodiment, and FIG. 21 is a plan view of the window structure of FIG. 20. More specifically, FIG. 20 is a cross-sectional view of the window structure of FIG. 21 taken along line IV-IV' of FIG. 21. The window structure in FIGS. 20 and 21 may be substantially the same as or similar to that of FIGS. 3 and 4, except that the window structure may not include a light absorption layer separate from the light shield layer and the light shield layer may have a different shape. Thus, like reference numerals refer to like elements, and detailed descriptions thereon are omitted herein Referring to FIGS. 20 and 21, a window structure 100 may include a window 110, and a first design layer structure 120 and a second light shield layer 132 sequentially stacked on the window 110.

The second light shield layer 132 may cover the first design layer 120 and be formed on the window 110. The second light shield layer 132 may have a fourth hole 137 within the first hole 125 that may expose a portion of the first surface 112 of the window 110. In an exemplary embodiment, the fourth hole 137 may have a circular shape when viewed from a top side, and the fourth hole 137 and the first hole 125 may be concentric circles.

In an exemplary embodiment, the fourth hole 137 may have a sidewall substantially perpendicular to the first surface 112 of the window 110. That is, the second light shield layer 132 may have a sidewall substantially perpendicular to the first surface 112 of the window 110.

The second light shield layer 132 may include a black printed layer or a gray printed layer. The second light shield layer 132 may cover the first design layer structure 120, and thus light may be prevented from being diffusely reflected at the first design layer structure 120, so that vignetting may be prevented. That is, the second light shield layer 132 may serve as both the light shield layer 130 and the first light absorption layer 140 of the window structure illustrated in FIGS. 3 and 4.

Figure 22:
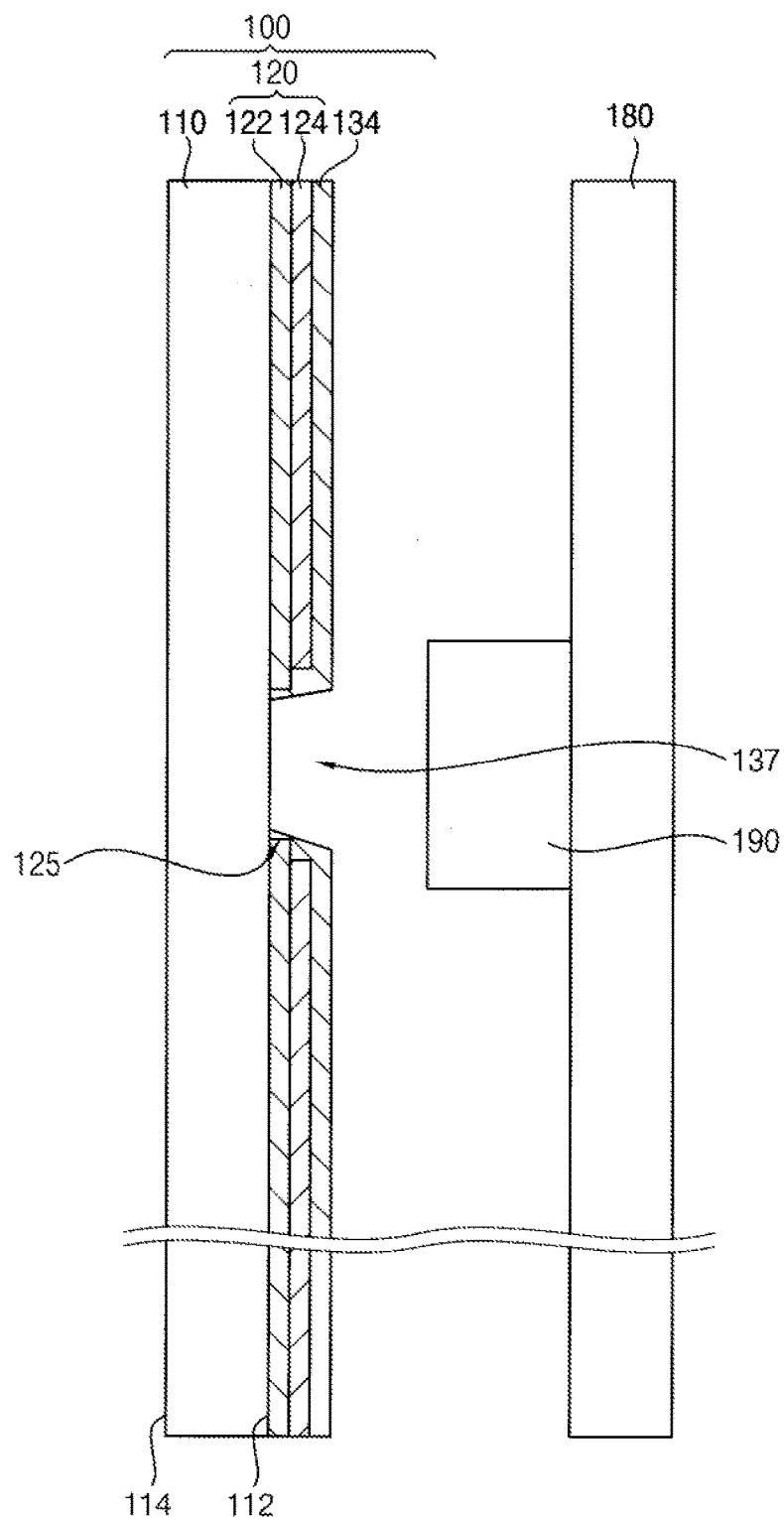
FIGS. 22 and 23 are cross-sectional views illustrating window structures in accordance with an exemplary embodiment.
Figure 23:
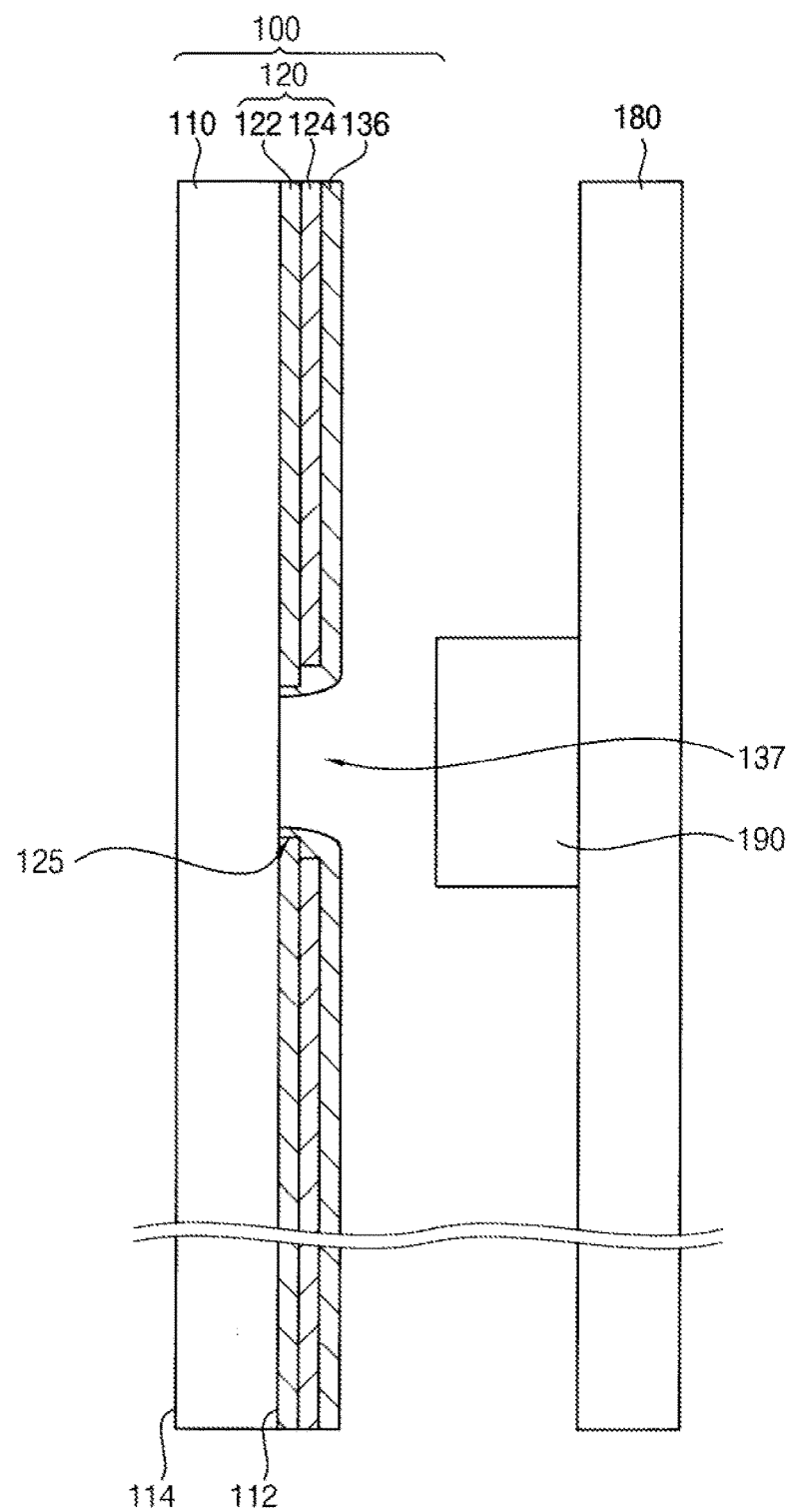

Turning now to FIGS. 22 and 23, FIGS. 22 and 23 are cross-sectional views illustrating window structures in accordance with another example embodiment. The window structures in FIGS. 22 and 23 may be substantially the same as or similar to that of FIGS. 20 and 21, except for the shape of a sidewall of the light shield layer. Thus, like reference numerals refer to like elements, and detailed descriptions thereon are omitted herein.

Referring now to FIG. 22, a window structure 100 may include a window 110, a first design layer structure 120 and a third light shield layer 134 sequentially stacked on the window 110. The third light shield layer 134 may have a sidewall that is not perpendicular to the first surface 112 of the window 110, but is instead and slanted or oblique thereto. This allows for the amount of light that may be reflected from an outside object, pass through the window 110 and be incident on the camera sensor 190 via the fourth hole 137 to be relatively increased.

Turning now to FIG. 23, the window structure 100 may instead include a window 110, a first design layer structure 120 and a fourth light shield layer 136 sequentially stacked on the window 110. The fourth light shield layer 136 may have a curved sidewall that is not perpendicular to the first surface 112 of the window 110 but is curved.

Figure 24:
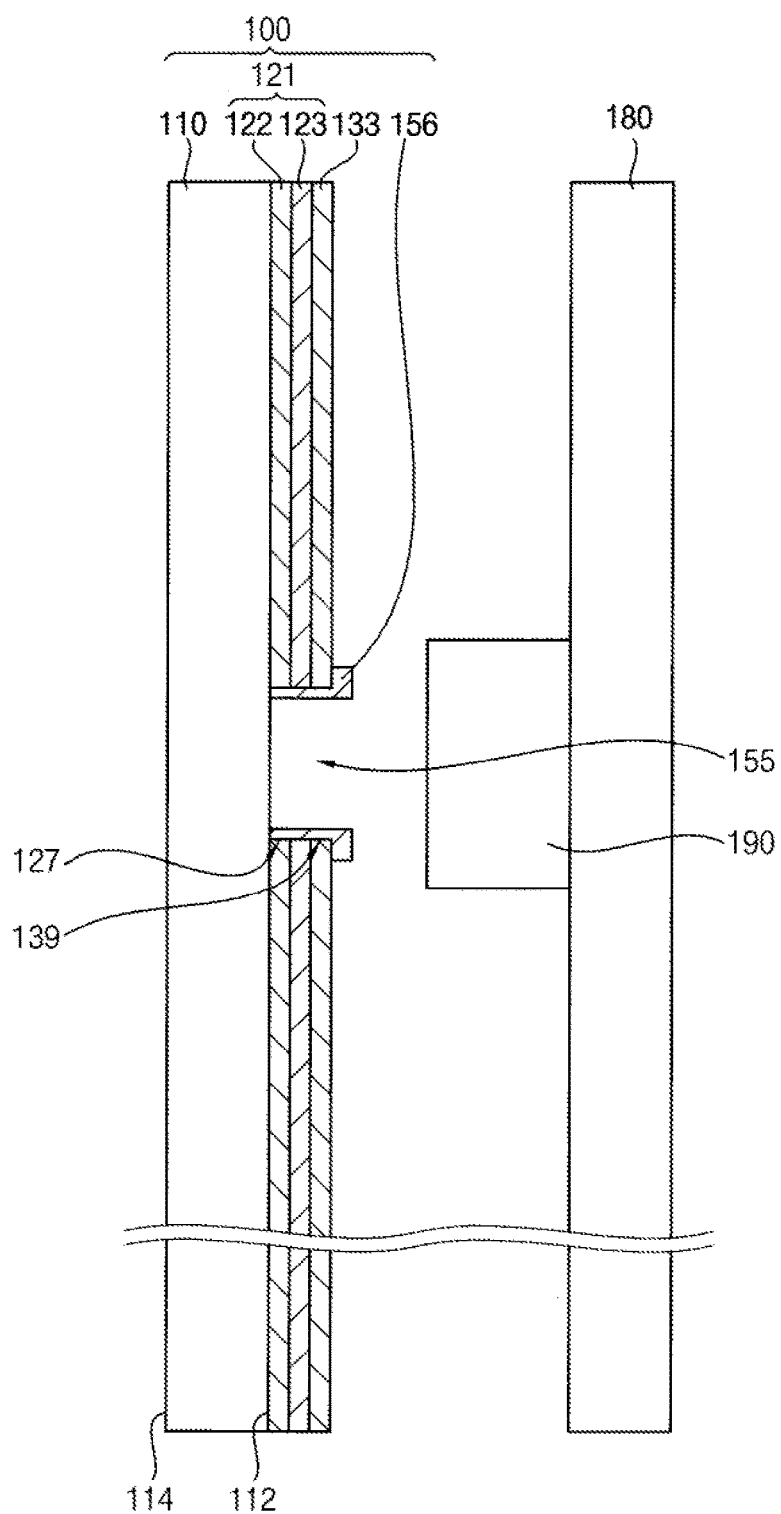
FIG. 24 is a cross-sectional view illustrating a window structure in accordance with an exemplary embodiment
Figure 25:
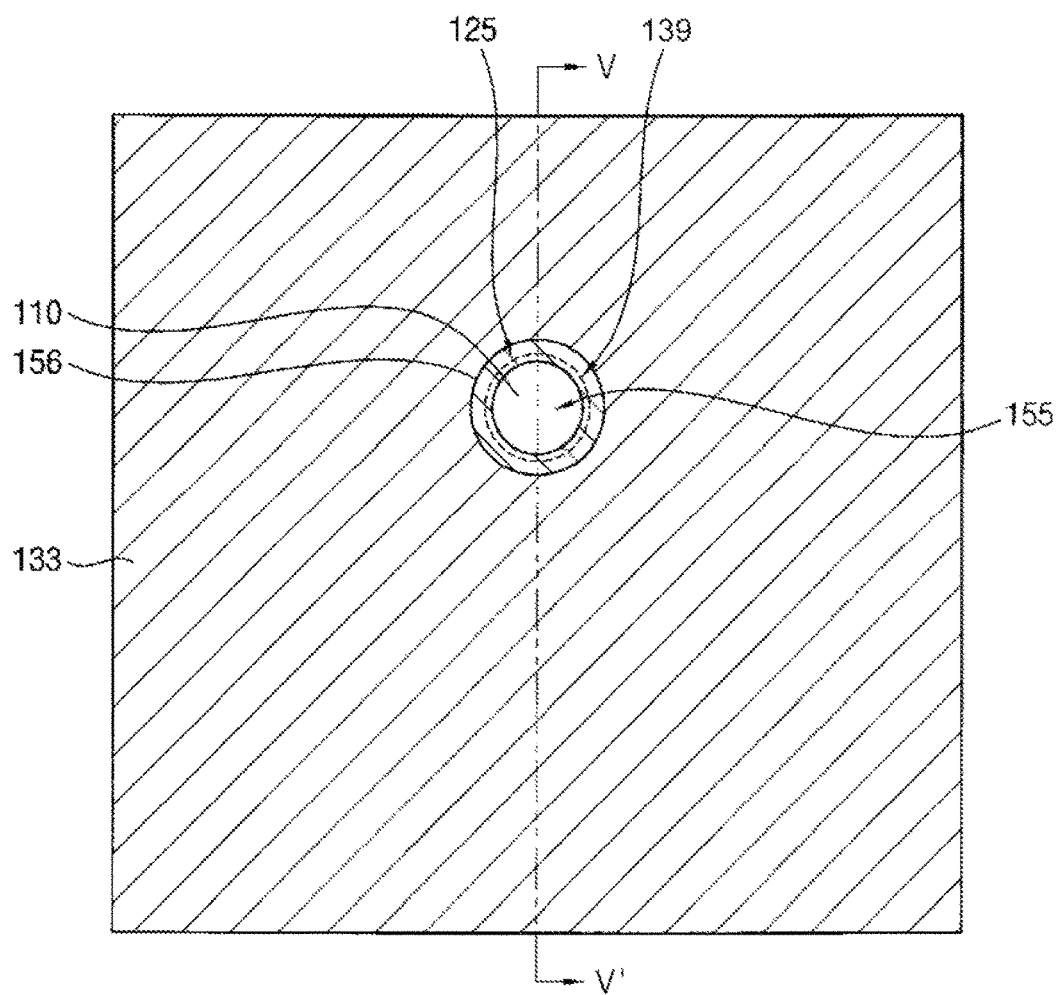
FIG. 25 is a plan view of the window structure of FIG. 24.

Turning now to FIGS. 24 and 25, FIG. 24 is a cross-sectional view illustrating a window structure in accordance with another example embodiment, and FIG. 25 is a plan view of the window structure of FIG. 24. More specifically, FIG. 24 a cross-sectional view of the window structure of FIG. 25 cut taken along line V-V' of FIG. 25. In FIG. 24, a camera sensor 190 that may be disposed facing the window structure 100 is also shown. The window structure 100 in FIG. 24 may be substantially the same as or similar to that of FIGS. 3 and 4, except for the shape of the design layer structure, the light shield layer and the light absorption layer. Thus, like reference numerals refer to like elements, and detailed descriptions thereon are omitted herein.

Referring now to FIGS. 24 and 25, a window structure 100 may include a window 110, a second design layer structure 121 and a fifth light shield layer 133 sequentially stacked on the window 110, and a ninth light absorption layer 156.

The second design layer structure 121 may include a first design layer 122 and a third design layer 123 sequentially stacked on the first surface 112 of the window 110. The third design layer 123 may entirely cover the first design layer 122. Thus, a fifth hole 127 of the second design layer structure 121 may have a constant diameter regardless of the distance from the first surface 112 of the window 110.

The fifth light shield layer 133 may be formed on a top surface of the second design layer structure 121 (i.e., a top surface of the third design layer 123), and may entirely cover the third design layer 123. Thus, the sixth hole 139 of the fifth light shield layer 133 may have a diameter substantially the same as that of the fifth hole 127. As a result, a second hole structure including the fifth hole 127 and the sixth hole 139 may have a constant diameter regardless of the distance from the first surface 112 of the window 110.

The ninth light absorption layer 156 may cover at least a portion of the second design layer structure 121 exposed by the fifth hole 127, i.e., sidewalls of the first and third design layers 122 and 123, and may have a seventh hole 155 exposing a portion of the first surface 112 of the window 110. The seventh hole 155 may be formed within the second hole structure including the fifth and sixth holes 127 and 139, and may have a diameter smaller than the second hole structure. The seventh hole 155 may have a circular shape when viewed from a top side, and the seventh hole 155 and the fifth hole 127 and/or the sixth hole 139 may be concentric circles. In this example embodiment, the seventh hole 155 may have a sidewall substantially perpendicular to the first surface 112 of the window 110. That is, the ninth light absorption layer 156 may have a sidewall substantially perpendicular to the first surface 112 of the window 110.

In an exemplary embodiment, the ninth light absorption layer 156 may cover not only the portion of the second design layer structure 121 but also a sidewall of the fifth light shield layer 133 exposed by or defining the sixth hole 139 and a portion of a top surface of the fifth light shield layer 133 adjacent to the sixth hole 139. The ninth light absorption layer 156 may have a boundary of a circle when viewed from a top. The boundary of the ninth light absorption layer 156 and the fifth and sixth holes 127 and 139 may be concentric circles. In an exemplary embodiment, the ninth light absorption layer 156 may have a top surface substantially parallel to the first surface 112 of the window 110.

Figure 26:
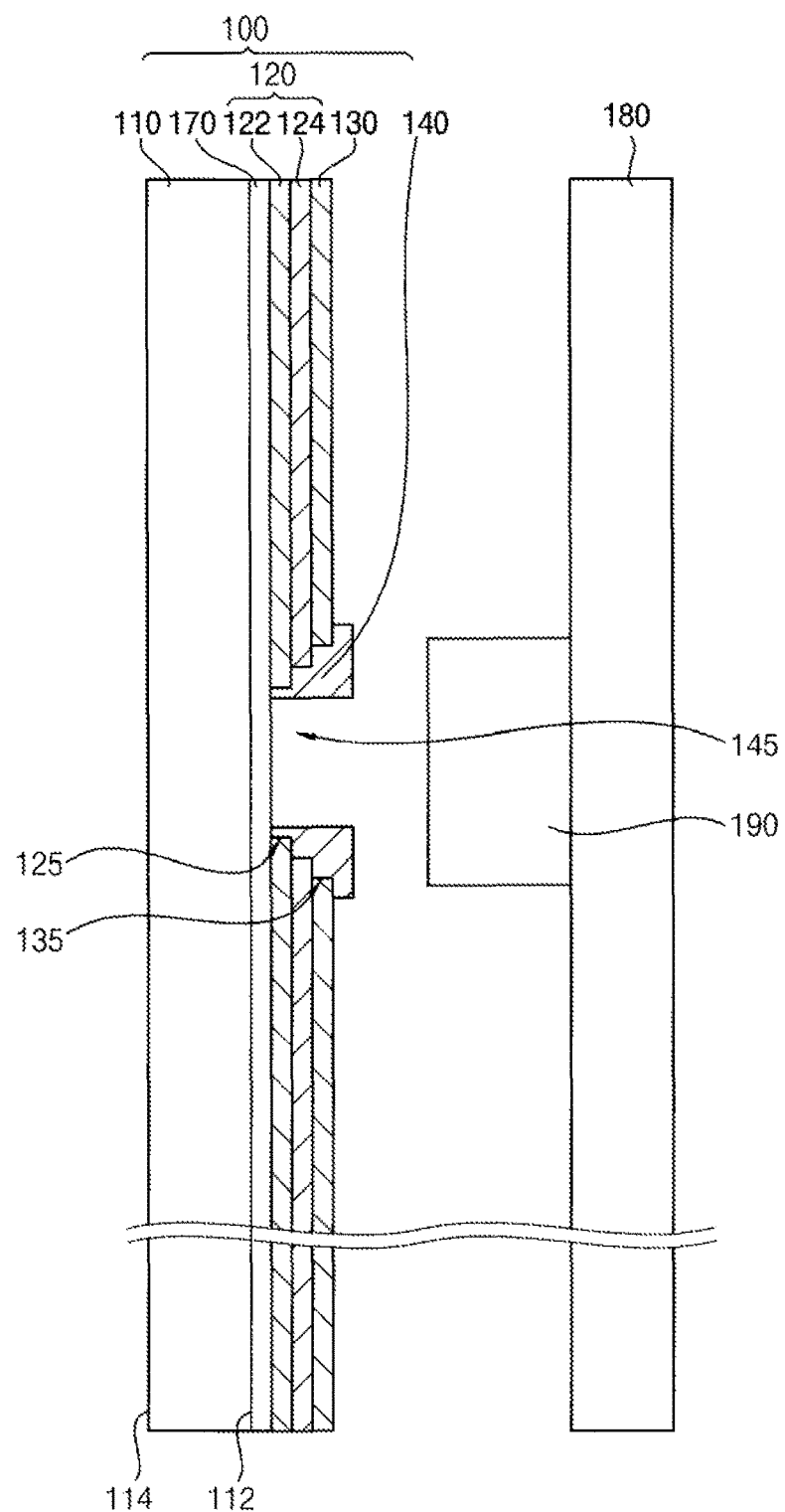
FIG. 26 is a cross-sectional view illustrating a window structure in accordance with an exemplary embodiment.

Turning now to FIG. 26, FIG. 26 is a cross-sectional view illustrating a window structure in accordance with another exemplary embodiment. The window structure in FIG. 26 may be substantially the same as or similar to that of FIGS. 3 and 4, except that the window structure further includes a polyethylene terephthalate (PET) film 170. Thus, like reference numerals refer to like elements, and detailed descriptions thereon are omitted herein.

Referring now to FIG. 26, a window structure 100 may include a window 110, a PET film 170, a first design layer structure 120 and a first light shield layer 130 sequentially stacked on the PET film 170, and a first light absorption layer 140.

The first design layer structure 120 may be printed with a high quality and may have a first hole 125 exposing a portion of a top surface of the PET film 170, and the first light shield layer 130 may have a second hole 135 in fluid communication with the first hole 125. The first light absorption layer 140 may cover at least a portion of the first design layer structure 120 exposed by the first and second holes 125 and 135, and have a third hole 145 exposing a portion of the top surface of the PET film 170.

The light transmissive PET film 170 may be formed on the first surface 112 of the window 110, and thus an amount of light incident on the camera sensor 190 may not be affected by PET film 170.

Figure 27:
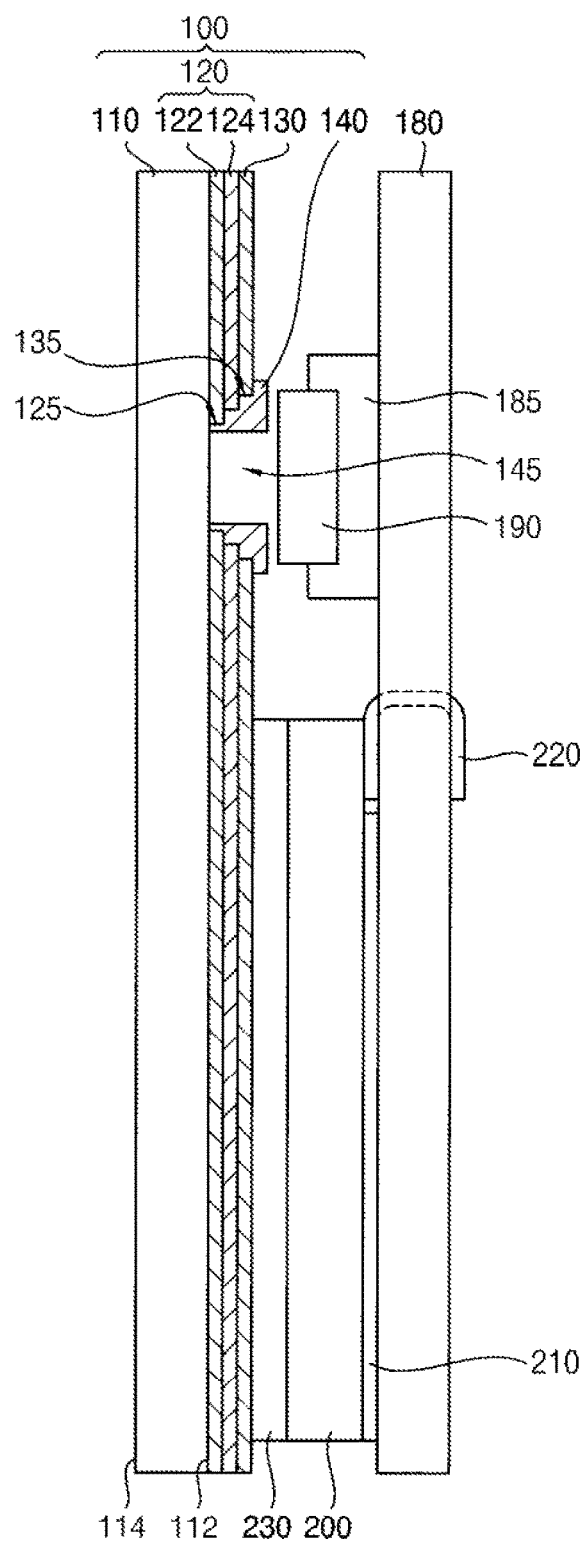
FIG. 27 is a cross-sectional view illustrating an electronic device equipped with a camera including a window structure in accordance with an exemplary embodiment.

Turning now to FIG. 27, FIG. 27 is a cross-sectional view illustrating an electronic device equipped with a camera and a window structure in accordance with another exemplary embodiment. The electronic device may include the window structure and the camera sensor illustrated with reference to FIGS. 3 and 4, and thus detailed descriptions thereon are omitted herein.

Referring now to FIG. 27, the electronic device may include a substrate 180, a display panel 200, a flexible printed circuit board (FPCB) 220, a window structure 100 and a camera sensor 190.

The substrate 180 may have various types of circuit wirings for driving the electronic device. In an exemplary embodiment, the substrate 180 may be a PCB.

The display panel 200 may be, e.g., an organic light-emitting diode (OLED) display panel, a liquid crystal display (LCD) panel, or a plasma display panel (PDP), etc. When the display panel 200 is the LCD panel or the PDP, the electronic device may further include a backlight assembly for providing a light to the panels. In present embodiment, the display panel 200 may be attached to the substrate 180 by an adhesive, e.g., a cushion tape 210.

The FPCB 220 may include a flexible resin and be connected a surface of the substrate 180 to provide a driving signal to the display panel 200. The FPCB 220 may make contact with a first surface of the display panel 200. FIG. 27 illustrates that FPBC is bent to contact the second surface of the substrate 180 that faces away from display panel 200, but FPCB 220 may instead be bent to contact a first surface of the substrate 180 that faces the display panel 200.

The window structure 100 may be formed on a second surface of the display panel 200 opposing the first surface of the display panel 200. The window structure 100 may be attached to the display panel 200 by an adhesive, e.g., super view resin (SVR).

The camera sensor 190 may be disposed facing the third hole 145 of the window structure 100, and may be disposed on the substrate 180 by for example a camera container 185.

The camera sensor 190 mounted in the electronic device may be disposed facing the third hole 145 of the window structure 100 that includes the first design layer structure 120, and vignetting may be prevent due to the presence of the first light absorption layer 140.

Figure 28:
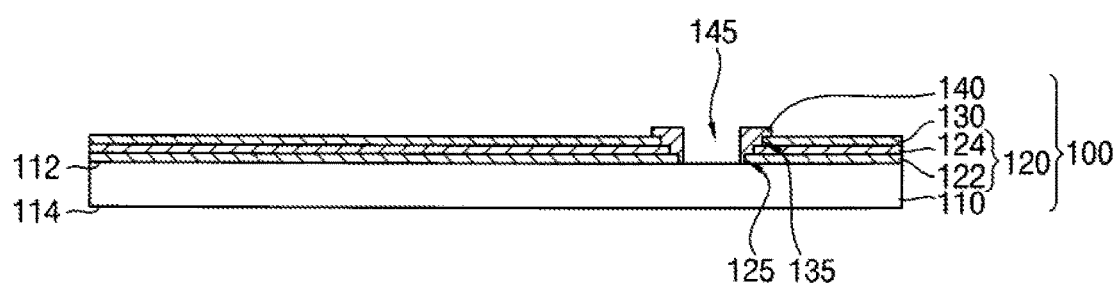
FIGS. 28 and 29 are cross-sectional views illustrating a method of manufacturing an electronic device equipped with a camera including a window structure in accordance with an exemplary embodiment.
Figure 29:
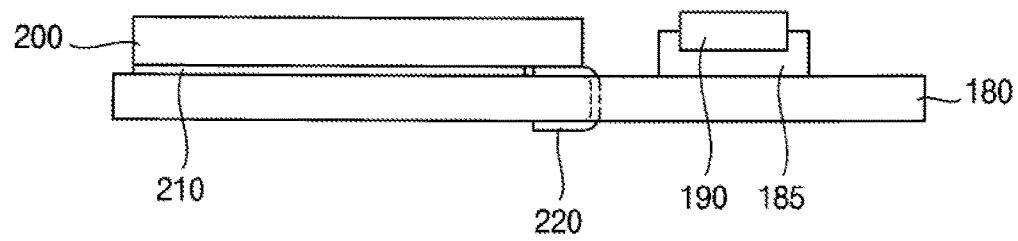

Turning now to FIGS. 28 and 29, FIGS. 28 and 29 are cross-sectional views illustrating a method of manufacturing an electronic device equipped with a camera including a window structure in accordance with an exemplary embodiment. More specifically, FIGS. 28 and 29 illustrate a method of manufacturing the electronic device of FIG. 27, however, these may not be limited thereto.

Referring now to FIG. 28, processes substantially the same as or similar to those illustrated with reference to FIGS. 6 to 13 may be performed to manufacture the window structure 100.

Referring now to FIG. 29, a camera container 185 may be mounted on a first surface of a substrate 180, and a camera sensor 190 may be mounted within the camera container 185. Additionally, a display panel 200 may be attached to the first surface of the substrate 180. In this embodiment, the first surface of the substrate 180 and a first surface of the display panel 200 may be attached to each other by an adhesive, e.g., cushion tape 210.

A FPCB 220 may be attached to the first surface of the display panel 200, and be bended to the second surface of the substrate 180 as illustrated in FIG. 29 or to a first surface opposing the first surface of the substrate 180.

Referring back to FIG. 27 again, a light transmissive adhesive 230, e.g., SVR may be coated onto the first light shield layer 130 of the window structure 100 so that the window structure 100 may be attached to the second surface of the display panel 200 to manufacture the electronic device. The window structure 100 may be attached so that the third hole 145 may face the camera sensor 190 mounted on the substrate 180.

Figure 30:
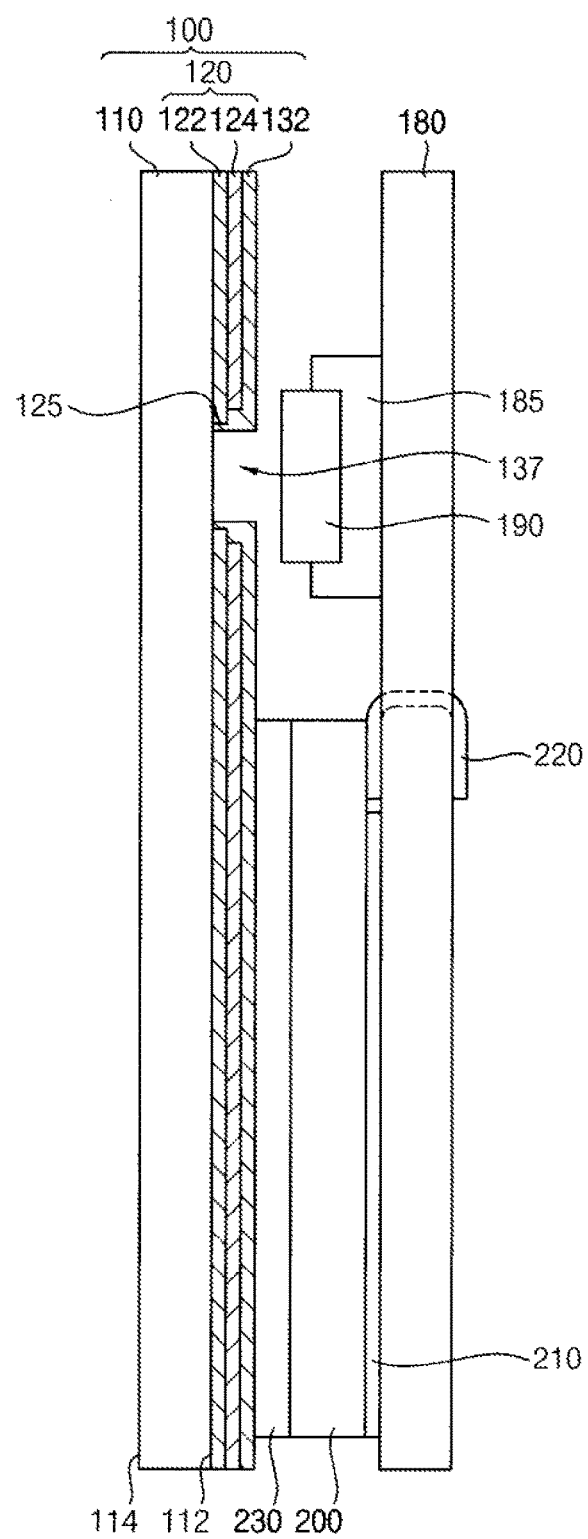
FIG. 30 is a cross-sectional view illustrating an electronic device equipped with a camera including a window structure in accordance with an exemplary embodiment.

Turning now to FIG. 30, FIG. 30 is a cross-sectional view illustrating an electronic device equipped with a camera including a window structure in accordance with an exemplary embodiment. The electronic device of FIG. 30 may be substantially the same as or similar to that of FIG. 27, except for the composition of the window structure. That is, the window structure of FIG. 30 does not include the first light absorption layer 140 of FIG. 27, but instead extends the second light shield layer to cover exposed portions of the first design layer structure 120 so that a vignette image is prevented. Thus, like reference numerals refer to like elements, and detailed descriptions thereon are omitted herein.

The window structure in accordance with an exemplary embodiment may be applied to any type of electronic devices having a display panel and a camera.

The foregoing is illustrative of an exemplary embodiment, and is not to be construed as limiting thereof. Although a few an exemplary embodiment have been described, those skilled in the art will readily appreciate that many modifications are possible in the exemplary embodiments without materially departing from the novel teachings and advantages of an exemplary embodiment. Accordingly, all such modifications are intended to be included within the scope of an exemplary embodiment as defined in the claims. In the claims, means-plus-function clauses are intended to cover the structures described herein as performing the recited function and not only structural equivalents but also equivalent structures. Therefore, it is to be understood that the foregoing is illustrative of an exemplary embodiment and is not to be construed as limited to the specific embodiments disclosed, and that modifications to the disclosed an exemplary embodiment, as well as other an exemplary embodiment, are intended to be included within the scope of the appended claims. The invention is defined by the following claims, with equivalents of the claims to be included therein.

What is claimed is:

1. A window structure, comprising:
   a window;
   a design layer structure arranged on the window, the design layer structure including a first hole exposing a portion of the window;
   a light shield layer arranged on the design layer structure, the light shield layer including a second hole in fluid communication with the first hole, and the light shield layer being different from the design layer structure; and
   a light absorption layer covering at least a portion of the design layer structure exposed by the first and second holes, the light absorption layer including a third hole exposing a portion of the window, wherein the third hole is arranged within a combination of the first hole and the second hole.

2. The window structure of claim 1, wherein the second hole has a diameter larger than that of the first hole, wherein the second hole exposes only portions of the design layer structure in a vicinity of the first hole, and wherein the light absorption layer is arranged only in a vicinity of the exposed portions of the design layer structure.

3. The window structure of claim 1, wherein the first and second holes have substantially a same diameter.

4. The window structure of claim 1, wherein the light absorption layer is absent from a surface of the light shield layer that faces away from the window.

5. The window structure of claim 1, wherein the design layer structure has a chromatic color or a white color, and the light shield layer and the light absorption layer have a black color or a gray color.

6. The window structure of claim 1, wherein each of the design layer structure, the light shield layer and the light absorption layer is a printed layer, the light shield layer being arranged on a side of the design layer structure opposite from that of the window.

7. The window structure of claim 1, wherein the first, second and third holes have a boundary of a circle when viewed from a top side, and the light absorption layer has a boundary of a circle, ellipse or polygon when viewed from a top side.

8. The window structure of claim 1, wherein the light absorption layer blocks all light reflecting off of portions of the design layer structure exposed by the second hole in the light shield layer and blocks all light that passes through portions of the design layer structure exposed by the second hole in the light shield layer.

9. The window structure of claim 1, further comprising a polyethylene terephthalate (PET) film arranged on the window, and wherein the design layer structure is arranged on the PET film.

10. The window structure of claim 1, wherein the third hole serves as a path through which a light incident on a camera sensor facing the light shield layer passes.

11. The window structure of claim 1, wherein the light absorption layer covers at least a portion of a sidewall of the light shield layer exposed by the second hole.

12. The window structure of claim 11, wherein the light absorption layer covers a portion of a surface of the light shield layer that faces away from the window.

13. The window structure of claim 1, wherein the design layer structure includes a plurality of design layers sequentially stacked on the window, the design layer structure being a contiguous structure where each of the plurality of layers are contiguous.

14. The window structure of claim 13, wherein the first hole has a sidewall profile of a step shape of which a diameter increases from a bottom portion adjacent to a top surface of the window to a top portion furthest from the top surface of the window.

15. The window structure of claim 13, wherein the first hole has a constant diameter in a direction substantially perpendicular to a top surface of the window.

16. The window structure of claim 15, wherein the first, second and third holes are concentric circles, wherein a diameter of the third hole is smaller than that of each of the first and second holes.

17. A method of manufacturing a window structure, comprising:

forming a design layer structure on a window, the design layer structure having a first hole exposing a portion of the window;

forming a light shield layer on the design layer structure, the light shield layer having a second hole in fluid communication with the first hole, and the light shield layer being different from the design layer structure; and forming a light absorption layer covering at least a portion of the design layer structure exposed by the first and second holes, the light absorption layer having a third hole exposing a portion of the window, wherein the third hole is arranged within a combination of the first hole and the second hole.

18. The method of claim 17, wherein the forming of the light shield layer includes forming the light shield layer so that the second hole has a diameter larger than that of the first hole, wherein the design layer structure has a chromatic color or a white color, and the light shield layer and the light absorption layer have a black color or a gray color, the light shield layer and the light absorption layer do not transmit visible light.

19. The method of claim 17, wherein the forming of the light shield layer occurs only subsequent to a completion of the forming of the design layer structure.

20. The method of claim 17, wherein the forming of the light absorption layer includes forming the light absorption layer to cover at least a portion of a sidewall of the light shield layer exposed by the second hole, wherein the sidewall of the light shield layer faces into the second hole.

21. The method of claim 20, wherein the forming of the light absorption layer includes forming the light absorption layer to cover a portion of a surface of the light shield layer that faces away from the window.

22. The method of claim 17, wherein the forming of the design layer structure includes sequentially stacking a plurality of design layers on the window so that they are contiguous.

23. The method of claim 22, wherein the forming of the design layer structure includes forming the design layer structure so that the first hole has a sidewall profile of a step shape of which a diameter increases from a bottom portion adjacent to a top surface of the window to a top portion most distant from the top surface of the window, wherein the second hole exposes only portions of the design layer structure in a vicinity of the first hole, and wherein the light absorption layer is arranged only in a vicinity of the exposed portions of the design layer structure.

24. A window structure, comprising:
a window;
a design layer structure arranged on the window, the design layer structure including a first hole exposing a portion of the window; and
a light shield layer arranged on the window, the light shield layer covering the design layer structure and including a second hole exposing a portion of the window, the second hole being in fluid communication with the first hole, and the light shield layer being different from the design layer structure.

25. The window structure of claim 24, the design layer structure includes a plurality of design layers sequentially stacked on the window, the design layer structure being a contiguous structure where each of the plurality of layers are contiguous.

26. The window structure of claim 25, wherein the design layer structure has a chromatic color or a white color, the light shield layer has a black color or a gray color, the light shield layer being arranged only on a side of the design layer structure opposite from the window.

27. An electronic device, comprising:
a display panel arranged on a substrate;
a window structure arranged on the display panel, the window structure including:
a window;
a design layer structure arranged on the window, the design layer structure including a first hole exposing a portion of the window;
a light shield layer arranged on the design layer structure, the light shield layer including a second hole in fluid communication with the first hole; and
a light absorption layer covering at least a portion of the design layer structure exposed by the first and second holes, the light absorption layer including a third hole exposing a portion of the window, the third hole being arranged within a combination of the first and second holes; and
a camera including a camera sensor arranged between the window structure and the substrate to detect light passing through the third hole.

28. The device of claim 27, wherein the second hole has a diameter larger than that of the first hole.

29. The device of claim 27, wherein the design layer structure has a chromatic color or a white color, and the light shield layer and the light absorption layer have a black color or a gray color.

30. The device of claim 27, wherein the window has first surface facing the substrate and a second surface opposing the first surface, and wherein the design layer structure is arranged on the first surface of the window.

31. The device of claim 27, wherein the display panel is an organic light-emitting diode (OLED) display panel, a liquid crystal display (LCD) panel or a plasma display panel (PDP).

32. The electronic device of claim 27, wherein the light absorption layer to prevent the camera sensor from being exposed to light reflecting off of portions of the design layer structure that are exposed by the second hole in the light shield layer, and to prevent the camera sensor from being exposed to light transmitting through the portions of the design layer structure that are exposed by the second hole in the light shield layer.

33. The electronic device of claim 27, wherein the first, second and third holes share a same center.

34. The device of claim 27, wherein the light absorption layer covers at least a portion of a sidewall of the light shield layer exposed by the second hole.

35. The device of claim 34, wherein the light absorption layer covers a portion of a surface of the light shield layer that faces away from the window.

36. The device of claim 27, wherein the design layer structure includes a plurality of design layers sequentially stacked on the window.

37. The device of claim 36, wherein the first hole has a sidewall profile of a step shape of which a diameter increases from a bottom portion adjacent to a top surface of the window to a top portion most distant from the top surface of the window.

38. A method of manufacturing an electronic device, comprising:
forming a display panel on a substrate;
forming a camera sensor on the substrate, the camera sensor being spaced apart from the display panel;
forming a window structure, including:
providing a window;
forming a design layer structure on the window, the design layer structure having a first hole exposing a portion of the window;
forming a light shield layer on the design layer structure, the light shield layer having a second hole in fluid communication with the first hole; and
forming a light absorption layer covering at least a portion of the design layer structure exposed by the first and second holes, the light absorption layer having a third hole exposing a portion of the window, the third hole being arranged within the first and second holes; and
attaching the window structure onto the display panel so that the third hole overlaps the camera sensor and the design layer structure faces the substrate.

39. The method of claim 38, wherein light absorption layer to prevent the camera sensor from being exposed to:
light reflecting off of portions of the design layer structure that are exposed by the second hole in the light shield layer;
light transmitting through the portions of the design layer structure that are exposed by the second hole in the light shield layer.

40. An electronic device, comprising:
a display panel arranged on a substrate;
a window structure arranged on the display panel, the window structure including:
a window;
a design layer structure arranged on the window, the design layer structure including a first hole exposing a portion of the window; and
a light shield layer arranged on the window, the light shield layer covering the design layer structure and including a second hole in fluid communication with the first hole to expose a portion of the window; and
a camera including a camera sensor arranged between the window structure and the substrate to detect light passing through the first and second holes.

41. The electronic device of claim 40, further comprising a light absorption layer arranged on the light shield layer and being perforated by a third hole, wherein the light absorption layer to prevent the camera sensor from being exposed to light reflecting off of portions of the design layer structure that are exposed by the second hole in the light shield layer, and to prevent the camera sensor from being exposed to light transmitting through the portions of the design layer structure that are exposed by the second hole in the light shield layer.

42. The window structure of claim 40, wherein the design layer structure being a contiguous structure, the light shield layer being arranged only on a side of the design layer structure opposite from the window, and wherein the light shield layer does not transmit light.

* * * * *